(12) United States Patent
Kim et al.

(10) Patent No.: US 11,222,997 B2
(45) Date of Patent: Jan. 11, 2022

(54) LUMINOUS BODY, LIGHT EMITTING FILM, LIGHT EMITTING DIODE AND LIGHT EMITTING DEVICE HAVING LUMINOUS BODY

(71) Applicant: LG Display Co., Ltd., Seoul (KR)

(72) Inventors: Dong-Young Kim, Paju-si (KR); Jong-Hoon Woo, Paju-si (KR); Byung-Geol Kim, Paju-si (KR); Hye-Li Min, Paju-si (KR); Min-Surk Hyung, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 529 days.

(21) Appl. No.: 16/163,066

(22) Filed: Oct. 17, 2018

(65) Prior Publication Data

US 2019/0115507 A1 Apr. 18, 2019

(30) Foreign Application Priority Data

Oct. 17, 2017 (KR) .................. 10-2017-0134500
Oct. 2, 2018 (KR) .................. 10-2018-0117488

(51) Int. Cl.
*C09K 11/62* (2006.01)
*C09K 11/02* (2006.01)
(Continued)

(52) U.S. Cl.
CPC ............ *H01L 33/504* (2013.01); *C09K 11/62* (2013.01); *C09K 11/70* (2013.01); *C09K 11/883* (2013.01); *G02B 5/206* (2013.01); *G02B 5/207* (2013.01); *G02B 5/22* (2013.01); *G02F 1/133603* (2013.01); *H01L 25/0753* (2013.01); *H01L 27/322* (2013.01); *H01L 33/28* (2013.01);
(Continued)

(58) Field of Classification Search
CPC .............................. C09K 11/62; C09K 11/025
See application file for complete search history.

(56) References Cited

U.S. PATENT DOCUMENTS 7,267,875 B2 * 9/2007 Whiteford .............. B82Y 30/00
427/372.2
7,576,478 B2 8/2009 Hikmet
(Continued)

FOREIGN PATENT DOCUMENTS

CN 102648536 A 8/2012
CN 105143235 A 12/2015
(Continued)

OTHER PUBLICATIONS

Liu. Thiol-Ene Click Reaction as a Facile and General Approach for Surface Functionalization of Colloidal Nanocrystals. Adv. Mater. Aug. 2017, 29, 1604878 (Year: 2017).*
(Continued)

*Primary Examiner* — Matthew E. Hoban
(74) *Attorney, Agent, or Firm* — Birch, Stewart, Kolasch & Birch, LLP

(57) ABSTRACT

A luminous body includes a first moiety including a plurality of first ligands combined to a surface of an inorganic emitting particle; and a second moiety including silsesquioxanes connected to a second ligand connected to one of the first ligands, wherein one of the first and second ligands is a polar ligand, and the other one of the first and second ligands is a non-polar ligand.

17 Claims, 15 Drawing Sheets

(51) Int. Cl.
| | |
|---|---|
| *H01L 33/50* | (2010.01) |
| *H01L 51/50* | (2006.01) |
| *H01L 51/52* | (2006.01) |
| *H01L 33/28* | (2010.01) |
| *H01L 33/30* | (2010.01) |
| *H01L 33/34* | (2010.01) |
| *G02F 1/13357* | (2006.01) |
| *H01L 27/32* | (2006.01) |
| *H05B 33/14* | (2006.01) |
| *C09K 11/88* | (2006.01) |
| *G02B 5/20* | (2006.01) |
| *G02B 5/22* | (2006.01) |
| *C09K 11/70* | (2006.01) |
| *H01L 25/075* | (2006.01) |
| *H01L 27/15* | (2006.01) |
| *G02F 1/1335* | (2006.01) |

(52) U.S. Cl.
CPC ............ *H01L 33/30* (2013.01); *H01L 33/346* (2013.01); *H01L 33/502* (2013.01); *H01L 51/502* (2013.01); *H01L 51/5036* (2013.01); *H01L 51/5206* (2013.01); *H01L 51/5221* (2013.01); *H01L 51/5237* (2013.01); *H05B 33/14* (2013.01); *G02F 1/133614* (2021.01); *G02F 2202/104* (2013.01); *G02F 2202/106* (2013.01); *G02F 2202/107* (2013.01); *H01L 27/156* (2013.01); *H01L 2251/303* (2013.01); *H01L 2251/533* (2013.01); *H01L 2251/5315* (2013.01)

(56) References Cited

U.S. PATENT DOCUMENTS

2003/0173541 A1* 9/2003 Peng ................. B01J 35/004
  252/301.4 R
2009/0213296 A1* 8/2009 Park ................. G02F 1/133621
  349/62
2012/0287381 A1* 11/2012 Li ..................... G02F 1/133617
  349/106
2014/0275598 A1  9/2014 Freeman et al.
2016/0149091 A1  5/2016 Kondo
2016/0218141 A1* 7/2016 Cai ........................ H01L 33/08

FOREIGN PATENT DOCUMENTS

| CN | 106195923 A | 12/2016 |
|---|---|---|
| JP | 2005-522005 A | 7/2005 |
| JP | 2012-169460 A | 9/2012 |
| JP | 2013-505346 A | 2/2013 |
| JP | 5664311 B2 | 2/2015 |
| JP | 2016-521251 A | 7/2016 |
| JP | 2017-512874 A | 5/2017 |
| TW | 200845433 A | 11/2008 |
| TW | 201238091 A1 | 9/2012 |
| TW | 201613086 A | 4/2016 |
| WO | WO 2017/146420 A1 | 8/2017 |

OTHER PUBLICATIONS

Vatansever et al., "Surface-initiated ring-opening metathesis polymerization (SI-ROMP) to attach a tethered organic corona onto CdSe/ZnS core/shell quantum dots", J Nanopart Res, vol. 18, No. 302, 2016 (published online Oct. 10, 2016), pp. 1-16.

Wang et al., "Polyhedral Oligomeric Silsesquioxane as a Ligand for CdSe Quantum Dots", J. Phys. Chem. C, vol. 117, 2013, pp. 1857-1862 (6 pages).

Kim et al., "High efficient OLED displays prepared with the air-gapped bridges on quantum dot patterns for optical recycling", Scientific Reports, 2017, total 8 pages.

* cited by examiner ated art.

LUMINOUS BODY, LIGHT EMITTING FILM, LIGHT EMITTING DIODE AND LIGHT EMITTING DEVICE HAVING LUMINOUS BODY

CROSS REFERENCE TO RELATED APPLICATIONS

The present application claims the priority benefit of Korean Patent Application No. 10-2017-0134500 filed in Republic of Korea on Oct. 17, 2017 and No. 10-2018-0117488 filed in Republic of Korea on Oct. 2, 2018, all of which are hereby incorporated by reference in its entirety for all purposes as if fully set forth herein.

BACKGROUND OF THE INVENTION

Field of the Invention

The present invention relates to a luminous body, and more particularly, to a luminous body where a dispersion property and an emission property to various solvents are improved, and to a light emitting film, a light emitting diode and a display device including the luminous body.

Discussion of the Related Art

As the information communication technology and the electronic engineering technology progress, various flat panel displays (FPDs) replacing a conventional cathode ray tube (CRT) have been researched. Specifically, a liquid crystal display (LCD) device or an organic light emitting diode (OLED) display device having a thin profile and a light weight as compared with the CRT has been the subject of recent research.

Among various FPDs, an OLED display device includes an organic light emitting diode of an emissive device as an essential element. Since the OLED display device does not require a backlight unit for an LCD device of a non-emissive device, the OLED display device has a light weight and a thin profile. Since the OLED display device has an advantage in power consumption as compared with the LCD device, the OLED display device has a low driving voltage and a fast response speed. Specifically, since the OLED display device has a simple fabrication process, production cost of the OLED display device is reduced as compared with the LCD device.

The OLED display device displays a full color image by emitting a red-colored light, a green-colored light and a blue-colored light using a red emitting layer, a green emitting layer and a blue emitting layer in a red pixel region, a green pixel region and a blue pixel region, respectively. The red, green and blue emitting layers are formed in the red, green and blue pixel regions, respectively, through a deposition process using a fine metal mask. However, the fine metal mask may not be applied to a fabrication process for a large-sized OLED display device. As a result, a white OLED display device of a red/green/blue/white structure where a light emitting diode emitting a white-colored light is formed in the whole pixel regions and a color filter layer is formed in the red, green and blue pixel regions has been suggested.

FIG. 1 is a cross-sectional view showing a white organic light emitting diode (OLED) display device according to the related art.

In FIG. 1, a white OLED display device 1 according to the related art includes a first substrate 10 where red, green, blue and white pixel regions Rp, Gp, Bp and Wp are defined, a second substrate 20 facing the first substrate 10, an organic light emitting diode (LED) 30 on an inner surface of the first substrate 10, and a color filter layer 40 on an inner surface of the second substrate 20.

Although not shown, a driving element such as a thin film transistor (TFT) is disposed in each pixel region on the inner surface of the first substrate 10, and the organic LED 30 includes a first electrode, an organic emitting layer and a second electrode. The first electrode are patterned in each pixel region and connected to the driving element.

The color filter layer 40 includes red, green and blue color filter patterns 42, 44 and 46 corresponding to the red, green and blue pixel regions Rp, Gp and Bp, respectively. Since a white-colored light emitted from the organic LED 30 passes through the red, green and blue color filter patterns 42, 44 and 46, the white OLED display device 1 displays a full color image.

In the white OLED display device 1, however, since a large amount of the white-colored light emitted from the organic LED 30 are absorbed by the color filter layer 40, a light efficiency is reduced. In the red pixel region Rp, since a component corresponding to a red wavelength of the white-colored light emitted from the organic LED 30 passes through the red color filter pattern 42 and a component corresponding to the other wavelength is absorbed by the red color filter pattern 42, a red-colored light is emitted. In the green pixel region Gp, since a component corresponding to a green wavelength of the white-colored light emitted from the organic LED 30 passes through the green color filter pattern 44 and a component corresponding to the other wavelength is absorbed by the green color filter pattern 44, a green-colored light is emitted. In the blue pixel region Bp, since a component corresponding to a blue wavelength of the white-colored light emitted from the organic LED 30 passes through the blue color filter pattern 46 and a component corresponding to the other wavelength is absorbed by the blue color filter pattern 46, a blue-colored light is emitted. Since the component corresponding to a specific wavelength passes through each of the red, green and blue color filter patterns 42, 44 and 46 and the component corresponding to the other wavelength is absorbed by each of the red, green and blue color filter patterns 42, 44 and 46, the light efficiency is reduced.

SUMMARY OF THE INVENTION

Accordingly, the present invention is directed to a luminous body, a light emitting film, a light emitting diode and a light emitting device having the luminous body that substantially obviates one or more of the problems due to limitations and disadvantages of the related art.

An object of the present invention is to provide a luminous body having an excellent dispersion property to various solvent and/or a matrix resin and an excellent emission property.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described herein, a luminous body includes a first moiety including a plurality of first ligands combined to a surface of an inorganic emitting particle; and a second moiety including silsesquioxanes connected to a second ligand connected to the first ligand, wherein one of the first and second ligands is a polar ligand, and the other one of the first and second ligands is a non-polar ligand.

In another aspect, a light emitting display device includes a first substrate; a second substrate facing the first substrate; a light emitting diode between the first and second substrates; a light converting layer converting a wavelength of a light emitted from the light emitting diode, the light converting layer including a luminous body, wherein the luminous body comprises a first moiety including a plurality of first ligands combined to a surface of an inorganic emitting particle; and a second moiety including silsesquioxanes connected to a second ligand connected to one of the first ligands, wherein one of the first and second ligands is a polar ligand, and the other one of the first and second ligands is a non-polar ligand.

In another aspect, a light emitting film includes a luminous body; and a matrix resin where the luminous body is dispersed, wherein the luminous body comprises a first moiety including a plurality of first ligands combined to a surface of an inorganic emitting particle; and a second moiety including silsesquioxanes connected to a second ligand connected to one of the first ligands, wherein one of the first and second ligands is a polar ligand, and the other one of the first and second ligands is a non-polar ligand.

In another aspect, a liquid crystal display device includes a liquid crystal panel; a backlight unit under the liquid crystal panel and including a light source; and a light emitting film between the liquid crystal panel and the backlight unit, wherein the light emitting film comprises a luminous body; and a matrix resin where the luminous body is dispersed, wherein the luminous body comprises a first moiety including a plurality of first ligands combined to a surface of an inorganic emitting particle; and a second moiety including silsesquioxanes connected to a second ligand connected to one of the first ligands, wherein one of the first and second ligands is a polar ligand, and the other one of the first and second ligands is a non-polar ligand.

In another aspect, an LED package includes an LED chip; and an encapsulation part covering the LED chip, the encapsulation part including a luminous body, wherein the luminous body comprises a first moiety including a plurality of first ligands combined to a surface of an inorganic emitting particle; and a second moiety including silsesquioxanes connected to a second ligand connected to one of the first ligands, wherein one of the first and second ligands is a polar ligand, and the other one of the first and second ligands is a non-polar ligand.

In another aspect, a liquid crystal display device includes a backlight unit including an LED package; and a liquid crystal panel over the backlight unit, wherein the LED package comprises an LED chip; and an encapsulation part covering the LED chip, the encapsulation part including a luminous body, wherein the luminous body comprises: a first moiety including a plurality of first ligands combined to a surface of an inorganic emitting particle; and a second moiety including silsesquioxanes connected to a second ligand connected to one of the first ligands, wherein one of the first and second ligands is a polar ligand, and the other one of the first and second ligands is a non-polar ligand.

In another aspect, an inorganic light emitting diode includes a first electrode; a second electrode facing the first electrode; and a light emitting layer between the first and second electrode, the light emitting layer including a luminous body, wherein the luminous body comprises a first moiety including a plurality of first ligands combined to a surface of an inorganic emitting particle; and a second moiety including silsesquioxanes connected to a second ligand connected to one of the first ligands, wherein one of the first and second ligands is a polar ligand, and the other one of the first and second ligands is a non-polar ligand.

In another aspect, an inorganic light emitting device includes a substrate; an inorganic light emitting diode on the substrate; and a driving element between the substrate and the inorganic light emitting diode, the driving element connected to the inorganic light emitting diode, wherein the inorganic light emitting diode comprises a first electrode; a second electrode facing the first electrode; and a light emitting layer between the first and second electrode, the light emitting layer including a luminous body, wherein the luminous body comprises: a first moiety including a plurality of first ligands combined to a surface of an inorganic emitting particle; and a second moiety including silsesquioxanes connected to a second ligand connected to one of the first ligands, wherein one of the first and second ligands is a polar ligand, and the other one of the first and second ligands is a non-polar ligand.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to the present disclosure, examples of which are illustrated in the accompanying drawings.

[Luminous Body]

Figure 1:
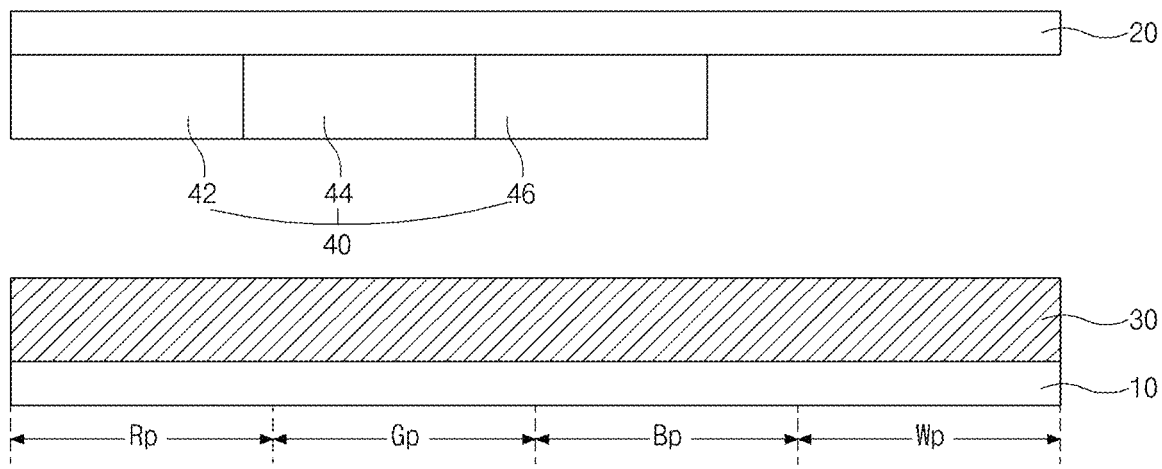
FIG. 1 is a cross-sectional view showing a white organic light emitting diode display device according to the related art.
Figure 2:
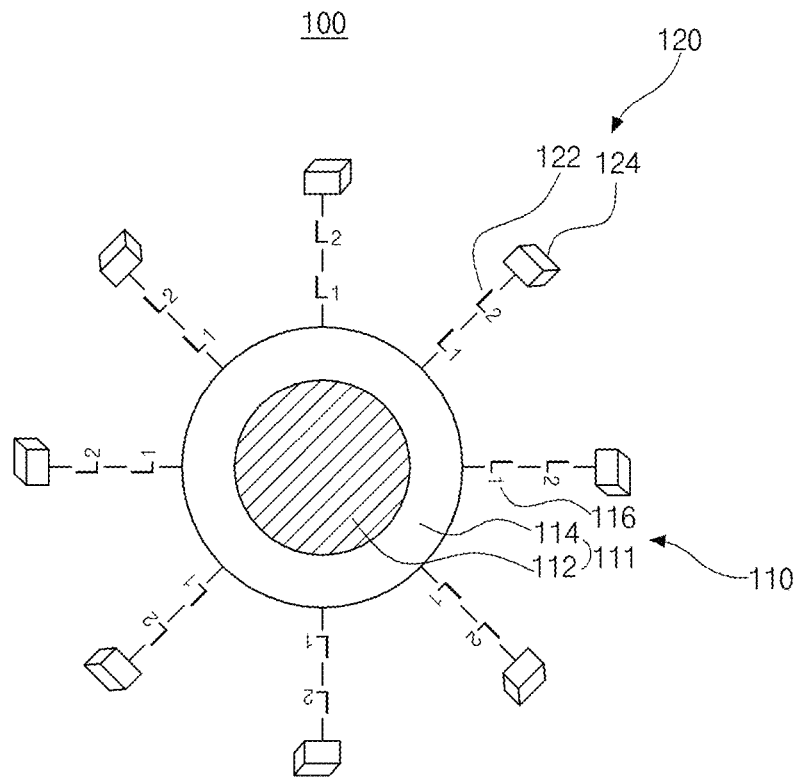
FIG. 2 is a view showing a luminous body having an improved dispersion property and an improved emission property according to a first embodiment of the present disclosure.

FIG. 2 is a view showing a luminous body having an improved dispersion property and an improved emission property according to a first embodiment of the present disclosure.

In FIG. 2, a luminous body 100 according to the first embodiment of the present disclosure includes a first moiety (emitting moiety) 110 having a first ligand ($L_1$) 116 combined to a surface of an inorganic emitting particle 111 and a second moiety (silsesquioxanes moiety) 120 having silsesquioxanes 124 combined to a second ligand ($L_2$) 122 connected to the first ligand 116.

The first moiety 110 includes the inorganic emitting particle 111 emitting a light and a plurality of first ligands 116 combined to a surface of the inorganic emitting particle 111. For example, the inorganic emitting particle 111 can include one of a quantum dot (QD) and a quantum rod (QR). When a first light is transmitted from a light source to the inorganic emitting particle 111, an electron of the inorganic emitting particle 111 transitions from a ground to an excited state. In addition, when the electron transitions from the excited state to the ground state, a second light can be emitted from the inorganic emitting particle 111. Alternatively, the inorganic emitting particle 111 can emit a light of a wavelength band by forming an exiton of an excited state due to a hole and an electron generated from two electrodes of a light emitting diode.

The inorganic emitting particle 111 such as a quantum dot or a quantum rod is an inorganic particle emitting a light when an electron of an unstable state transitions from a conduction band to a valence band. Since the inorganic emitting particle 111 has a relatively high extinction coefficient and an excellent quantum yield, the inorganic emitting particle 111 can generate a relatively strong fluorescent light. In addition, since a wavelength of the emitted light is changed according to a size of the inorganic emitting particle 111, a light of a whole wavelengths corresponding to a visible ray is obtained by adjusting a size of the inorganic emitting particle 111 to display various colors.

The inorganic emitting particle 111 can have a single structure. Alternatively, the inorganic emitting particle 111 can have a heterologous structure where a core 112 emitting a light is disposed at a center portion and a shell 114 wraps a surface of the core 112 to protect the core 112. Here, the shell 114 can be formed of a single shell or multiple shells. A growth degree and a crystal structure of the nano inorganic emitting particle 111 can be adjusted according to a reaction property of a reaction precursor for the core 112 and/or the shell 114, a kind of a ligand and a reaction temperature. As a result, an emission of a light of various wavelength bands can be induced according to an adjustment of an energy band gap.

For example, the inorganic emitting particle 111 can have a type-I core/shell heterologous structure where the core 112 having a first energy band gap is wrapped by the shell 114 having a second energy band gap. In the type-I core/shell heterologous structure, an electron and a hole move to the core 112 and are recombined with each other in the core to emit an energy as a light. Since the core 112 is a substantial portion emitting a light, a wavelength of the light emitted from the inorganic emitting particle 111 can be determined according to a size of the core 112. To obtain a quantum confine effect, the core 112 is required to have a radius smaller than an exciton Bohr radius according to a material and the core 112 having the determined size (radius) is required to have a target optical band gap.

The shell 114 can promote the quantum confine effect and can determine a stability of the inorganic emitting particle 111. Atoms exposed at a surface of a colloid quantum dot or a colloid quantum rod of a single structure have a state of lone pair of electrons where electrons do not participate in a chemical combination differently from inner atoms. Since an energy level of the surficial atoms traps charges between a conduction band and a valence band of the inorganic emitting particle 111, the inorganic emitting particle 111 can have a surface defect. As a result, an emission efficiency of the inorganic emitting particle 111 can be reduced by a non-radiative recombination process of the exciton due to the surface defect. In addition, the trapped charges can react to an exterior oxygen and an exterior compound to cause modification in a chemical composition of the inorganic emitting particle 111, and an electrical/optical property of the inorganic emitting particle 111 can be permanently removed.

To form the shell on the surface of the core 112 effectively, it is required that a lattice constant of a material of the shell 114 is similar to a lattice constant of a material of the core 112. Since the surface of the core 112 is wrapped by the shell 114, an oxidation of the core 112 is prevented to improve a chemical stability of the inorganic emitting particle 111, and deterioration of an optical property of the core 112 due to an exterior factor such as a water or an oxygen is prevented. Further, a loss of the exciton due to the trap on the surface of the core 112 is minimized, and an energy loss due to an atomic vibration is prevented to improve a quantum efficiency.

The inorganic emitting particle 111 can include a semiconductor nano crystal or a metal oxide particle having the quantum confine effect. For example, a quantum dot or a quantum rod can include a nano semiconductor compound of a II-VI group, a III-V group, a IV-VI group or a group. The core 112 and/or the shell 114 of the inorganic emitting particle 111 can include one of a II-VI group chemical semiconductor nano crystal such as CdS, CdSe, CdTe, ZnS, ZnSe, ZnTe, HgS and HgTe or a combination thereof; a III-V group chemical semiconductor nano such as GaP, GaAs, GaSb, InP, InAs and InSb or a combination thereof; a IV-VI group chemical semiconductor nano such as PbS, PbSe and PbTe or a combination thereof; a group chemical semiconductor nano such as $AgGaS_2$, $AgGaSe_2$, $AgGaTe_2$, $AgInS_2$, $CuInS_2$, $CuInSe_2$, $CuGaS_2$ and $CuGaSe_2$ or a combination thereof; a metal oxide nano particle such as ZnO and $TiO_2$ or a combination thereof; a nano crystal of a core/shell structure such as CdSe/ZnSe, CdSe/ZnS, CdS/ZnSe, CdS/ZnS, ZnSe/ZnS, InP/ZnS and ZnO/MgO or a combination thereof. The semiconductor nano particle can be doped with a rare earth element such as Eu, Er, Tb, Tm and Dy or a combination thereof or with a transition metal element such as Mn, Cu, Ag and Al or a combination thereof, or cannot be doped.

For example, the core 112 of the inorganic emitting particle 111 can be selected from a group including ZnSe, ZnTe, CdSe, CdTe, InP, ZnCdS, $Cu_xIn_{1-x}S$, $Cu_xIn_{1-x}Se$ and $Ag_xIn_{1-x}S$ and a combination thereof. The shell 114 of the inorganic emitting particle 111 can be selected from a group including ZnS, GaP, CdS, ZnSe, CdS/ZnS, ZnSe/ZnS, ZnS/ZnSe/CdSe, GaP/ZnS, CdS/CdZnS/ZnS, ZnS/CdSZnS and $Cd_xZn_{1-x}S$ or a combination thereof.

The quantum dot of the inorganic emitting particle 111 can include an alloy quantum dot such as a homogeneous alloy quantum dot or a gradient alloy quantum dot (e.g., $CdS_xSe_{1-x}$, $CdSe_xTe_{1-x}$, $Zn_xCd_{1-x}Se$).

The luminous body 100 according to the first embodiment of the present disclosure includes the first moiety 110 having the first ligand 116 combined to the surface of the inorganic emitting particle 111 and the second moiety 120 having silsesquioxanes 124 combined to the second ligand 122 that combined to the first ligand 116.

A unit structure of siloxanes including a combination of Si—O—Si can be classified into a Q type $(Si(O)_4)$, a T type $(Si(O)_3OR, Si(O)_3R)$, a D type $(Si(O)_2(OR)_2, Si(O)_2(R)_2)$ and an M type $(Si(O)(OR)_3), Si(OR)_4, Si(O)(R)_3, Si(R)_4)$ according to the number of an oxygen atom connected to silicon and the number of a substituent. The second moiety 120 at an outer portion of the luminous body 100 can include silsesquioxanes 124 having a siloxanes unit of a T type and a bulky property. Silsesquioxanes can be defined as a T type siloxanes expressed by $(RSiO_{3/2})_n$ (R is hydrogen, $C_1$~$C_{10}$ alkyl group or alkylene group or $C_2$~$C_{10}$ allyl group or arylene group, n is 6, 8, 10, 12 or 16) and can be synthesized through a hydrolysis-polymerization method using trialkoxysilane $(RSi(OR)_3)$ or trichlorosilane $(RSiCl_3)$. Silsesquioxanes can have one of a ladder structure, a cage structure and a random structure according to a structure and a shape of cross-linkage. The case structure can be classified into a complete cage structure and an incomplete cage structure (a partial cage/open cage structure) where a portion is ring-open. Specifically, silsesquioxanes having the cage structure referred to as polyhedral oligomeric silsesquioxanes (POSS) can have a complete structure where n is 6, 8, 10, 12 or 16 or an incomplete structure where silanol group is disposed at an outer portion.

Silsesquioxanes of the second moiety of the luminous body 100 according to a first embodiment of the present disclosure can have one of a random structure, a ladder structure, an incomplete cage structure and a complete cage structure or another structure. Silsesquioxanes can have a cage structure of a bulky structure and an excellent structural stability. For example, silsesquioxanes can have a structure where a random structure and a cage structure are mixed.

The first and second ligands 116 and 122 can perform a function of dispersing the inorganic emitting particle 111 to a solvent, and one of the first and second ligands 116 and 122 is a polar ligand and the other one of the first and second ligands 116 and 122 is a non-polar ligand. For example, the first and second ligands 116 and 122 can be non-polar and polar ligands, respectively.

In the inorganic emitting particle according to the related art, since a non-polar ligand such as aliphatic hydrocarbon chain is connected to the surface of the inorganic emitting particle, the inorganic emitting particle may be dispersed to a non-polar solvent. However, the inorganic emitting particle may not be dispersed to a polar solvent.

Further, in the inorganic emitting particle according to the related art where one ligand is combined to the surface of the inorganic emitting particle, when two inorganic emitting particles (a donor inorganic emitting particle and an acceptor inorganic emitting particle) are disposed within a predetermined distance, a light emitted from the donor inorganic emitting particle is absorbed by the acceptor. Since an energy of the donor inorganic emitting particle is not transmitted to the donor inorganic emitting particle and is transmitted to the acceptor inorganic emitting particle, the acceptor inorganic emitting particle is excited and a fluorescent resonance energy transfer (Forster resonance energy transfer) (FRET) phenomenon where a fluorescent light of the acceptor inorganic emitting particle is induced occurs. As a result, a quantum efficiency or an emission efficiency of the inorganic emitting particle according to the related art is deteriorated.

In the inorganic emitting particle 111 according to the first embodiment of the present disclosure, since both of the first ligand 116 of a non-polar ligand and the second ligand 122 of a polar ligand are combined to the surface of the inorganic emitting particle 111, the luminous body 100 can be uniformly dispersed to a non-polar solvent as well as a polar solvent.

When a layer or a pattern including the luminous body 100 is formed through a soluble process, a solvent where an adjacent layer or an adjacent pattern is not dissolved and only the luminous body 100 is dispersed and dissolved can be used for the soluble process. Since mixing of the luminous body 100 for a layer or a pattern and the other material for the adjacent layer or the adjacent pattern is prevented, the luminous body 100 and the other material can function adequately.

Further, since silsesquioxanes 124 having a bulky property is combined to an outermost portion of the luminous body 100, the two inorganic emitting particles 111 emitting a light are not disposed within a predetermined distance. Since the second moieties each including the silsesquioxanes 124 having a bulky property are combined to the surface of the inorganic emitting particle 111, the adjacent two inorganic emitting particles 111 are not disposed within a predetermined distance causing the FRET phenomenon. As a result, when the luminous body 100 according to a first embodiment of the present disclosure is used, the FRET phenomenon is prevented, and an excellent quantum efficiency and an excellent emission efficiency are obtained.

For example, the non-polar ligand (e.g., the first ligand 116) can include $C_1$~$C_{20}$ alkylene group, and the polar ligand (e.g., the second ligand 122) can include sulfide group (—S) having $C_1$~$C_{20}$ alkyl group. When the first ligand 116 is $C_1$~$C_{20}$ alkylene group and the second ligand 122 is sulfide group (—S) having $C_1$~$C_{20}$ alkyl group, the luminous body 100 according to a first embodiment of the present disclosure can be fabricated through a following method.

The luminous body 100 can be fabricated by a reaction of an inorganic emitting particle precursor where an initial ligand including the first ligand 116 is combined to a surface thereof and a silsesquioxanes precursor where the second ligand 122 having thiol group at an end thereof is combined. The initial ligand can be $C_2 \sim C_{30}$ aliphatic hydrocarbon (e.g., $C_2 \sim C_{30}$ alkenyl group where hydrogen is not substituted or is substituted with amine group) having a double bond. The second ligand 122 can be thiol group combined to silsesquioxanes through $C_1 \sim C_{20}$ alkyl group.

An inorganic emitting particle precursor where an initial ligand such as oleylamine and/or oleic acid having a double bond is combined to a surface of the inorganic emitting particle 111 is prepared. If necessary, another initial ligand such as trioctylphosphine and dodecanthiol can be further combined to the surface of the inorganic emitting particle precursor.

Next, a silsesquioxanes precursor where $C_1 \sim C_{20}$ alkyl thiol group (—SH) is combined to a part of silsesquioxanes is mixed to the inorganic emitting particle precursor. A heat treatment can be performed to the mixture of the inorganic emitting particle precursor and the silsesquioxanes precursor. For example, the heat treatment can be performed in $N_2$ atmosphere or vacuum at a temperature over about 200° C. (e.g., about 200° C. to about 500° C.) for a time of about 1 min to about 20 min.

A thiolene reaction where $C_1 \sim C_{20}$ alkyl sulfide radical (—S radical) from the $C_1 \sim C_{20}$ alkyl thiol group of the silsesquioxanes precursor attacks the double bond of the initial ligand (e.g., oleylamine and/or oleic acid) combined to the surface of the inorganic emitting particle precursor is induced by a heat treatment. The double bond of the initial ligand (e.g., oleylamine and/or oleic acid) combined to the surface of the inorganic emitting particle precursor is broken through the thiolene reaction. When the double bond of the initial ligand is broken, only the non-polar ligand of $C_1 \sim C_{20}$ alkylene ligand combined to the surface of the inorganic emitting particle precursor among alkylene ligands at both sides of the double bond remains on the surface of the inorganic emitting particle.

The polar ligand of $C_1 \sim C_{20}$ alkyl sulfide ligand from $C_1 \sim C_{20}$ alkyl thiol group is combined to an open end of $C_1 \sim C_{20}$ alkylene ligand remaining on the surface of the inorganic emitting particle. Since a ligand exchange reaction is induced from the initial ligand, the non-polar ligand of $C_1 \sim C_{20}$ alkylene ligand-the polar ligand of $C_1 \sim C_{20}$ alkyl sulfide ligand-silsesquioxanes are sequentially combined to the surface of the inorganic emitting particle. As a result, the luminous body where the non-polar ligand of $C_1 \sim C_{20}$ alkylene ligand is formed on the surface of the inorganic emitting particle and silsesquioxanes is combined through the polar ligand of $C_1 \sim C_{20}$ alkyl sulfide ligand combined to the other end of the alkylene ligand from the broken double bond of the initial ligand is synthesized.

The heat treatment at a high temperature over about 200° C. is performed to induce the thiolene reaction. The inorganic emitting particle 111 can be deteriorated by the heat treatment at a high temperature and a quantum yield (QY) of the luminous body 100 can be greatly reduced.

In another embodiment, the thiolene reaction can be induced at a low temperature by using a catalyst with the inorganic emitting particle precursor and the silsesquioxanes precursor. When the catalyst is used, the thiolene reaction can be induced by a reaction of the inorganic emitting particle precursor and the silsesquioxanes precursor in nitrogen ($N_2$) atmosphere or vacuum at a temperature of about 70° C. to about 150° C. (preferably, about 80° C. to about 130° C.) for a time of about 1 min to about 30 min (preferably, about 5 min to about 20 min). Since the reaction is progressed in a relatively lower temperature, deterioration of the inorganic emitting particle 110 is prevented and reduction in a quantum yield of the luminous body 100 is prevented. In addition, agglutination of $SiO_2$ is prevented due to a reaction between silicon-oxygen constituting silsesquioxanes, and the luminous body 100 uniformly dispersed is fabricated through the reaction of the inorganic emitting particle 110 and the silsesquioxanes precursor.

Although the catalyst accelerating the thiolene reaction between the inorganic emitting particle precursor and the silsesquioxanes precursor is not specifically limited, the catalyst can be peroxide having an aromatic ring and/or a nitrile compound having azo coupling. For example, peroxide having an aromatic ring can be selected from a group including cumyl hydroperoxide (2-hydroperoxypropan-2-yl benzene), benzoyl peroxide (BPO) and a combination thereof. The nitrile compound having azo coupling can include 2,2y include nation thereof. The nitrile compound having (AIBN).

Although a composition ratio of the catalyst is not specifically limited, the catalyst can have a composition ratio of about 0.1 wt % to about 5 wt % (preferably, about 0.5 wt % to about 2 wt %) with respect to a solution where the inorganic emitting particle precursor and the silsesquioxanes precursor.

[Emitting Film, LED Package And Liquid Crystal Display Device]

The luminous body 100 according to the first embodiment of the present disclosure has an excellent dispersion property to a non-polar solvent and a polar solvent and an excellent dispersion property to a heat resistant matrix resin. Further, the luminous body 100 according to the first embodiment of the present disclosure has a high heat resistance property and an excellent emission property.

Figure 3:
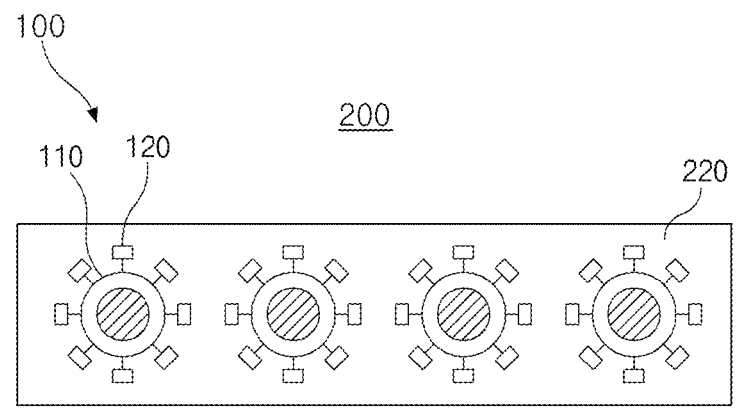
FIG. 3 is a view showing a light emitting film according to the first embodiment of the present disclosure.

FIG. 3 is a view showing a light emitting film according to the first embodiment of the present disclosure. All the components of the light emitting film according to all embodiments of the present disclosure are operatively coupled and configured.

In FIG. 3, a light emitting film 200 according to the first embodiment of the present disclosure includes a luminous body 100 having a first moiety 110 and a second moiety 120 connected to the first moiety 110 and a matrix resin 220 where the luminous body 100 is dispersed. The first moiety 110 includes a first ligand ($L_1$) 116 (of FIG. 2) combined to a surface of an inorganic emitting particle 111 (of FIG. 2) and the second moiety 120 includes silsesquioxanes 124 (of FIG. 2) combined to a second ligand ($L_2$) 122 (of FIG. 2) connected to the first ligand 116. Although the matrix resin 220 where the luminous body 100 is dispersed is not specifically limited, the matrix resin 220 can include a polymer material having an excellent heat resistance property such as an epoxy resin, a silicone resin and/or a polyimide resin.

An inorganic emitting particle 111 (of FIG. 2) constituting the first moiety 110 can have a heterologous structure of a core 112 (of FIG. 2) and a shell 114 (of FIG. 2). Various colors can be easily obtained by adjusting a material and a size of the core 112 constituting the inorganic emitting particle 111. Since the core 112 is protected by the shell 114, a trap energy level is reduced.

Since one of the first and second ligands 116 and 122 is a non-polar ligand and the other one of the first and second ligands 116 and 122 is a polar ligand, the luminous body 100 can be dispersed to various polar solvents and various non-polar solvents. In addition, since silsesquioxanes 124 of the second moiety 120 is formed on the inorganic emitting body 111, a heat resistance property of the luminous body 100 is improved and the luminous body 100 has an excellent dispersion property to the matrix resin 220 such as silicone resin. Since silsesquioxanes 124 having a bulky property is formed on an outer portion of the luminous body 100, a distance between the adjacent inorganic emitting particles 111 is reduced, and an FRET phenomenon between the adjacent inorganic emitting particles 111 is minimized.

A display device including the light emitting film will be illustrated hereinafter. All the components of the display devices according to all embodiments of the present disclosure are operatively coupled and configured.

Figure 4:
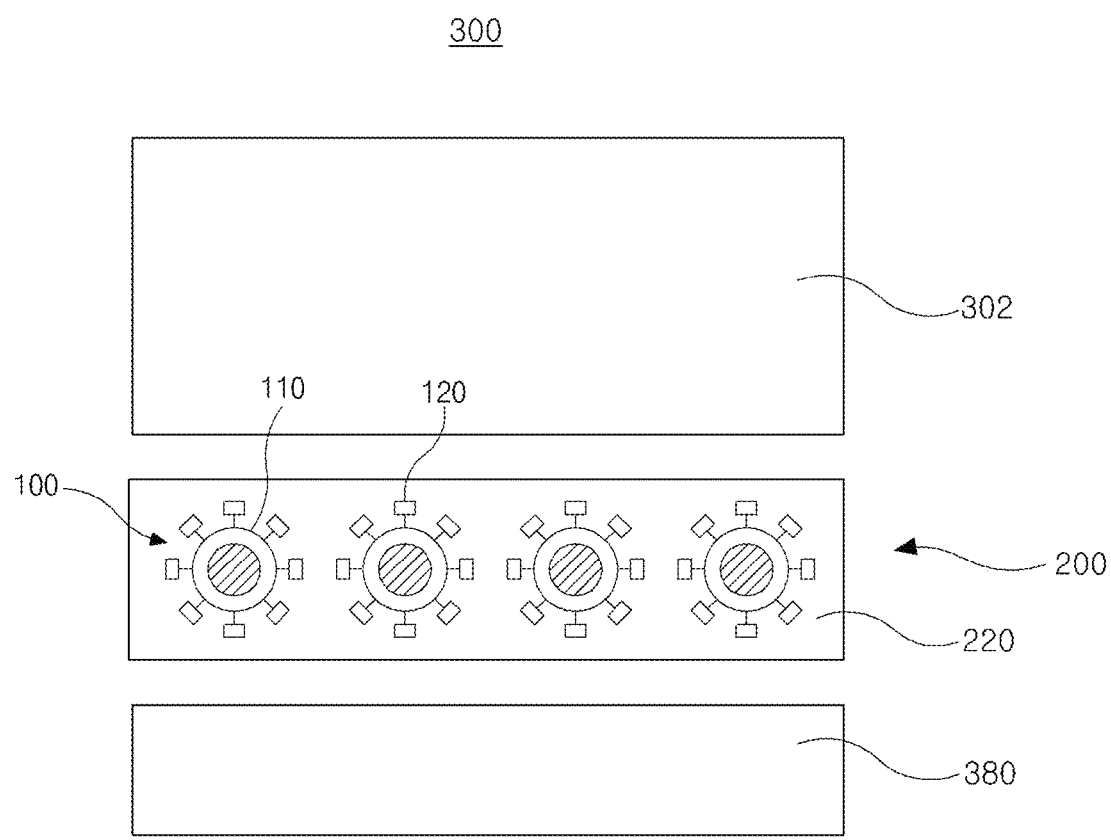
FIG. 4 is a cross-sectional view showing a liquid crystal display device including the light emitting film according to the first embodiment of the present disclosure.
Figure 5:
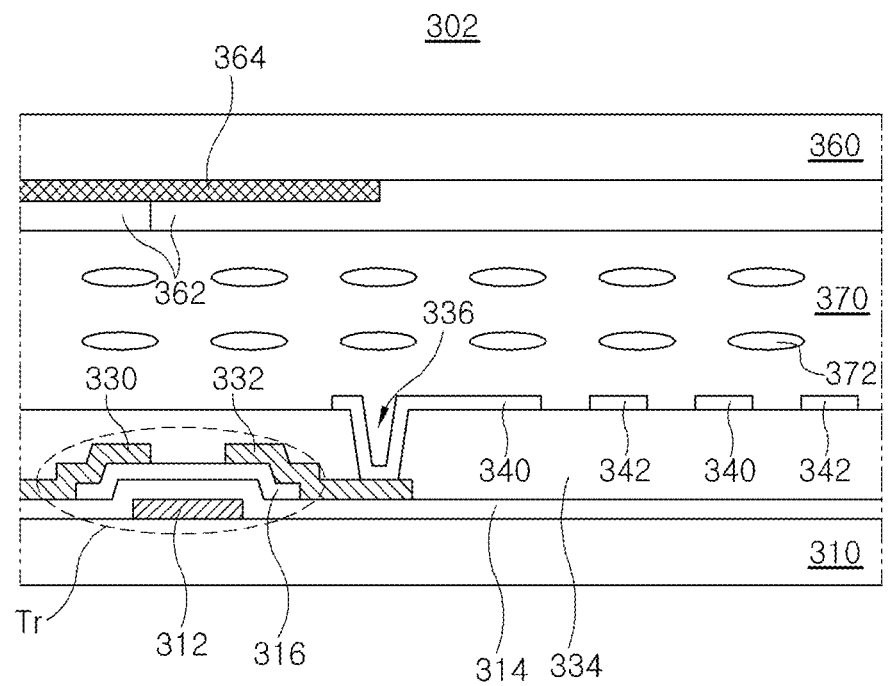
FIG. 5 is a cross-sectional view showing a liquid crystal panel of FIG. 4.

FIG. 4 is a cross-sectional view showing a liquid crystal display device including a light emitting film according to the first embodiment of the present disclosure, and FIG. 5 is a cross-sectional view showing a liquid crystal panel of FIG. 4.

In FIG. 4, a liquid crystal display (LCD) device 300 according to the first embodiment of the present disclosure includes a liquid crystal panel 302, a backlight unit 380 under the liquid crystal panel 302 and a light emitting film 200 between the liquid crystal panel 302 and the backlight unit 380.

In FIG. 5, the liquid crystal panel 302 includes first and second substrates 310 and 360 facing each other and a liquid crystal layer 370 between the first and second substrates 310 and 360. The liquid crystal layer 370 includes a liquid crystal molecule 372.

A gate electrode 312 is formed on an inner surface of the first substrate 310 and a gate insulating layer 314 is formed on the gate electrode 312. A gate line connected to gate electrode 312 is formed on the inner surface of the first substrate 310.

A semiconductor layer 316 is formed on the gate insulating layer 314 corresponding to the gate electrode 312. The semiconductor layer 316 can include an oxide semiconductor material. Alternatively, the semiconductor layer 316 can include an active layer of amorphous silicon and an ohmic contact layer of impurity-doped amorphous silicon.

A source electrode 330 and a drain electrode 332 spaced apart from each other are formed on the semiconductor layer 316. A data line connected to the source electrode 330 crosses the gate line to define a pixel region. The gate electrode 312, the semiconductor layer 316, the source electrode 330 and the drain electrode 332 constitute a thin film transistor (TFT) Tr.

A passivation layer 334 having a drain contact hole 336 exposing the drain electrode 332 is formed on the TFT Tr. A pixel electrode 340 of a first electrode connected to the drain electrode 332 through the drain contact hole 336 and a common electrode 342 of a second electrode alternating with the pixel electrode 340 are formed on the passivation layer 334.

A black matrix 364 covering a non-display area including the TFT Tr, the gate line and the data line is formed on an inner surface of the second substrate 360. A color filter layer 362 is formed on the inner surface of the second substrate 360 corresponding to the pixel region.

The first and second substrates 310 and 360 are attached to each other with the liquid crystal layer 370 interposed therebetween, and the liquid crystal molecule 372 of the liquid crystal layer 370 is driven by an electric field generated between the pixel electrode 340 and the common electrode 342. Aligning layers can be formed on the inner surfaces of the first and second substrates 310 and 360 to contact the liquid crystal layer 370, and polarizing plates having perpendicular transmission axes can be attached to outer surfaces of the first and second substrates 310 and 360.

Referring again in FIG. 4, the backlight unit 380 includes a light source and supplies a light to the liquid crystal panel 302. The backlight unit 380 can be classified into a direct type and a side type according to a position of the light source.

In the direct type, the backlight unit 380 includes a bottom frame surrounding a lower portion of the liquid crystal panel 302, and a plurality of light sources are disposed on a horizontal surface of the bottom frame. In the side type, the backlight unit 380 includes a bottom frame surrounding a lower portion of the liquid crystal panel 302, a light guide plate is disposed on a horizontal surface of the bottom frame, and the light source is disposed at one or more sides of the light guide plate. The light source can emit a light having a red-colored wavelength (e.g., a wavelength band of about 430 nm to about 470 nm).

The light emitting film 200 is disposed between the liquid crystal panel 302 and the backlight unit 380 and improves a color purity of the light provided from the backlight unit 380. For example, the light emitting film 200 can include the luminous body 100 having the first moiety 110 including the inorganic emitting particle 111 (of FIG. 2) and the second moiety 120 including silsesquioxanes and the matrix resin 220 where the luminous body 100 is dispersed. The first moiety 110 includes the first ligand ($L_1$) 116 (of FIG. 2) combined to the surface of the inorganic emitting particle 111 and the second moiety 120 includes silsesquioxanes 124 (of FIG. 2) combined to the second ligand ($L_2$) 122 (of FIG. 2) connected to the first ligand 116.

Since one of the first and second ligands 116 and 122 is a non-polar ligand and the other one of the first and second ligands 116 and 122 is a polar ligand, the luminous body 100 can be dispersed to various polar solvents and various non-polar solvents. In addition, since the inorganic emitting body 111 includes silsesquioxanes 124, the luminous body 100 has an excellent heat resistance property and an excellent dispersion property to the matrix resin 220 such as silicone resin. Since silsesquioxanes 124 having a bulky property is formed on an outer portion of the luminous body 100, an FRET phenomenon between the adjacent inorganic emitting particles 111 is prevented to obtain an excellent emission property.

A light emitting diode package including the light emitting particle will be illustrated hereinafter. All the components of the light emitting diode packages according to all embodiments of the present disclosure are operatively coupled and configured.

Figure 6:
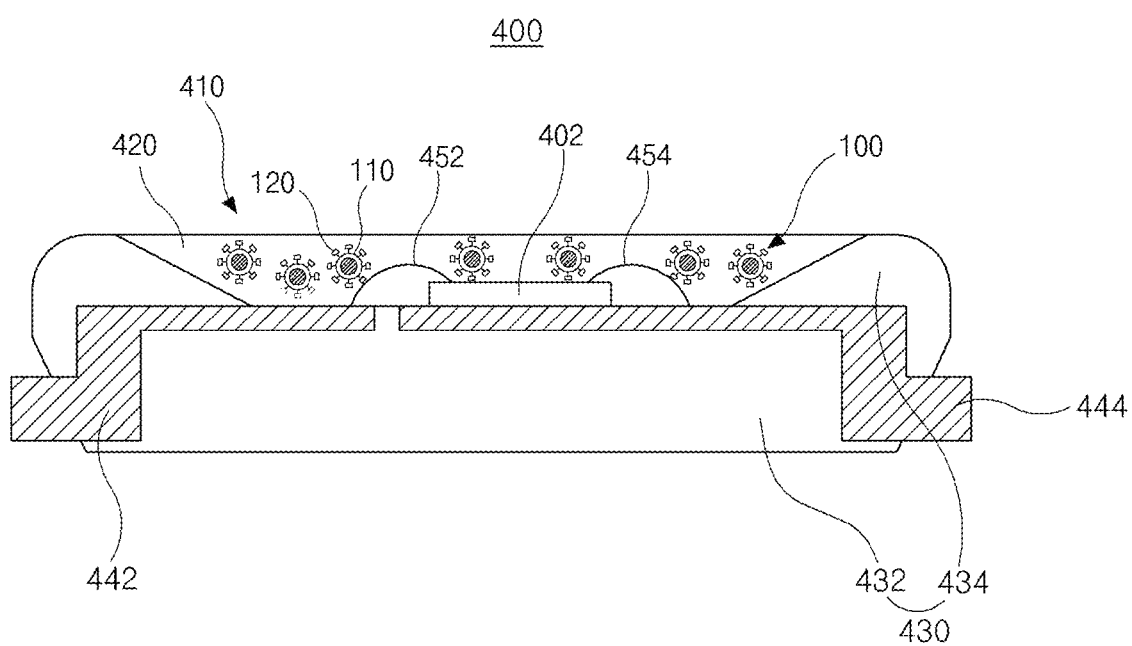
FIG. 6 is a cross-sectional view showing a light emitting diode package according to a second embodiment of the present disclosure.

FIG. 6 is a cross-sectional view showing a light emitting diode package according to a second embodiment of the present disclosure.

In FIG. 6, a light emitting diode (LED) package 400 includes an LED chip 402 and an encapsulation part 410 covering the LED chip 402. The encapsulation part 410 includes a luminous body 100 as an emitting material having a first moiety 110 including an inorganic emitting particle 111 (of FIG. 2) and a second moiety 120 including silsesquioxanes 124 (of FIG. 2). The encapsulation part 410 can further include a matrix resin 420 as an encapsulating resin where the luminous body 100 is dispersed. For example, the luminous body 100 can be dispersed to the matrix resin 420 having an excellent heat resistance property such as an epoxy resin, a silicone resin and/or a polyimide resin.

The LED package 400 can be a white LED package emitting a white-colored light. For the white LED package, the LED chip 402 emitting an ultraviolet (UV) light can be used as a light source, and the encapsulation part 410 can include the luminous body 100 emitting a red-colored light, a green-colored light and a blue-colored light. Alternatively, the LED chip 402 emitting a blue-colored light can be used as a light source, and the encapsulation part 410 can include the luminous body 100 emitting a yellow-colored light, a green-colored light and/or a red-colored light.

For example, the LED chip 402 can be a blue LED chip emitting a light of a wavelength of about 430 nm to about 470 nm, and the inorganic emitting particle 111 of the luminous body 100 can be a quantum dot or a quantum rod emitting a light of a green-colored wavelength and/or a red-colored wavelength. The blue LED chip 402 can include sapphire as a substrate and a material having a blue peak wavelength as a light source for excitation. For example, the material for the blue LED chip 402 can include GaN, InGaN, InGaN/GaN, $BaMgAl_{10}O_7:Eu^{2+}$, $CaMgSi2O6:Eu^{2+}$ or a combination thereof.

The inorganic emitting particle 111 absorbing the blue-colored light from the blue LED chip of the light source and emitting a light of a predetermined wavelength band can be used for the white LED package. The inorganic emitting particle 111 can be coated on the blue LED chip 402 to obtain the white LED package as a whole.

The LED package 400 can further include a case 430 and first and second electrode leads 442 and 444 connected to the LED chip 402 through first and second wires 452 and 454, respectively, and exposed outside the case 430. The case 430 include a body 432 and a sidewall 434 protruding from an upper surface of the body 432 to function as a reflecting surface. The LED chip 402 is disposed on the body 432 and surrounded by the sidewall 434.

Emission of various wavelength bands can be obtained by adjusting a composition and an ingredient of the inorganic emitting particle 111 constituting the first moiety 110 of the luminous body 100 according to a second embodiment of the present disclosure. For example, a quantum efficiency can be improved and deterioration of an optical property can be prevented by using the inorganic emitting particle 111 having a heterologous structure of the core 112 (of FIG. 2) and the shell 114 (of FIG. 2). Since the luminous body 100 includes silsesquioxanes 124 (of FIG. 2) of the second moiety 120, a dispersion property with respect to the heat resistive matrix resin 420 such as silicone resin is improved and an FRET phenomenon according to adjacent disposition of the inorganic emitting particles 111 is prevented. As a result, a luminance of the LED package 400 including the luminous body 100 increases, and a luminance of an LCD device including the LED package 400 increases greatly.

[Light Emitting Device Including Light Converting Layer]

Since the luminous body 100 according to the first embodiment of the present disclosure has an excellent dispersion property to various non-polar solvents and various polar solvents and an excellent emission property, the luminous body 100 can be applied to a light converting layer of a light emitting device.

Figure 7:
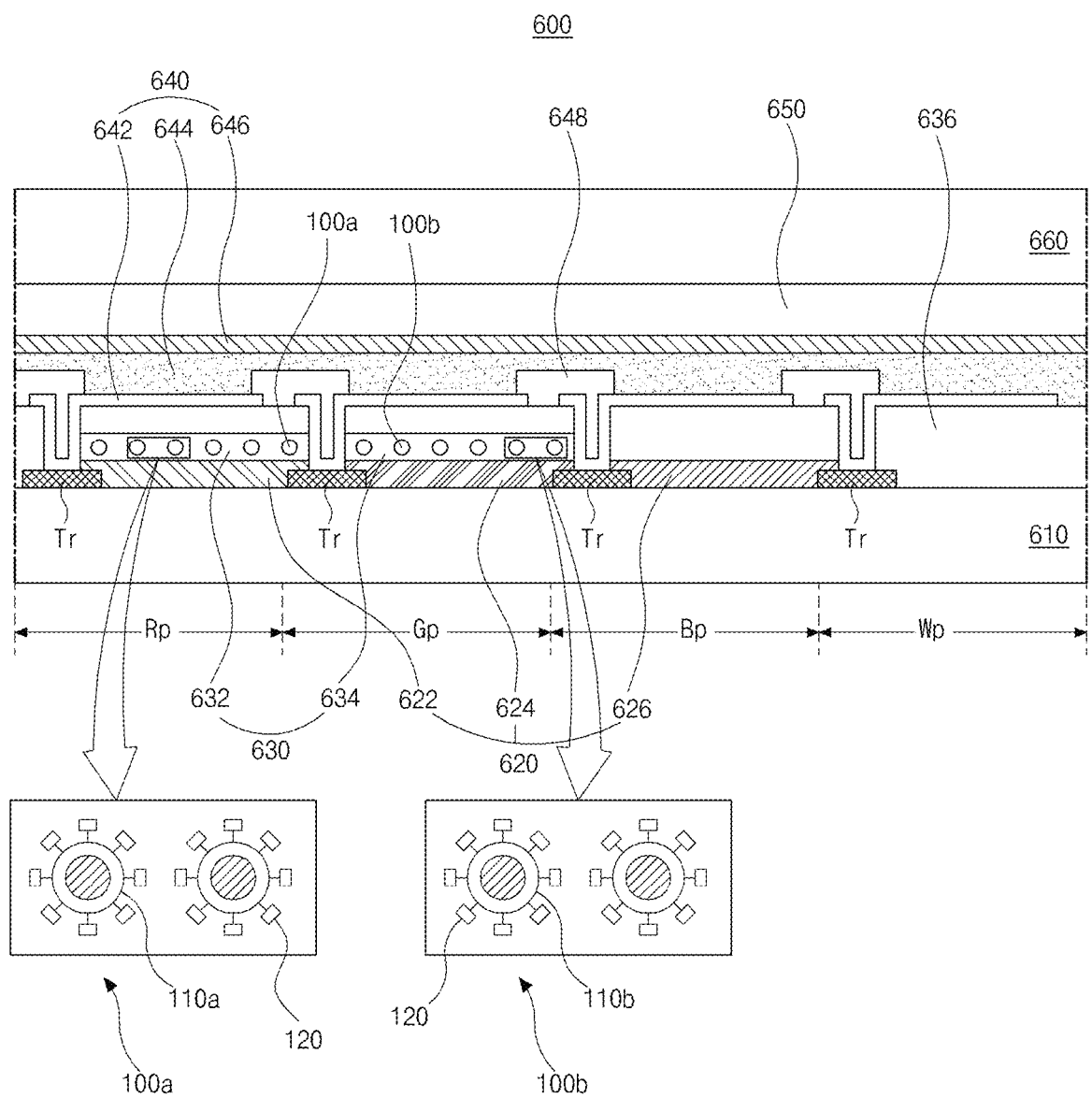
FIG. 7 is a cross-sectional view showing a light emitting device having a luminous body according to a third embodiment of the present disclosure.

FIG. 7 is a cross-sectional view showing a light emitting device having a luminous body according to a third embodiment of the present disclosure. As an example, the light emitting device is a white organic light emitting diode display device of a bottom emission type.

In FIG. 7, an organic light emitting diode (OLED) display device 600 according to the third embodiment of the present disclosure includes a first substrate 610 where red, green, blue and white pixel regions Rp, Gp, Bp and Wp are defined, a second substrate 660 facing the first substrate 610, a light emitting diode (LED) 640 between the first and second substrates 610 and 660, a color filter layer 620 between the first substrate 610 and the LED 640 and a light converting layer 630 between the color filter layer 620 and the LED 640. The color filter layer 620 corresponds to the red, green and blue pixel regions Rp, Gp and Bp, and the light converting layer 630 correspond to the red and green pixel regions Rp and Gp.

The first substrate 610 can include a transparent material. For example, the first substrate 610 can include a plastic such as polyimide or a glass. The second substrate 660 can include a transparent material or an opaque material. For example, the second substrate 660 can include a glass, a plastic such as polyimide or a metal foil.

A polarizing plate can be attached to a display surface of the OLED display device 600, i.e., an outer surface of the first substrate 610 to prevent reflection of an external light on the LED 640. The polarizing plate can be a right-handed circular polarizing plate or a left-handed circular polarizing plate.

An adhesive layer 650 is disposed between the second substrate 660 and the LED 640, and a barrier layer can be formed on the LED 640 and the adhesive layer 650 for preventing penetration of external moisture. Here, the barrier layer can have a triple layer structure of an inorganic layer, an organic layer and an inorganic layer sequentially on the LED 640. Although not shown, a gate line and a data line crossing each other to define the red, green, blue and white pixel regions Rp, Gp, Bp and Wp are formed on an inner surface of the first substrate 610, and a power line parallel to and spaced apart from one of the gate line and the data line is formed on the inner surface of the first substrate 610.

A thin film transistor (TFT) Tr of a driving element is disposed in each of the red, green, blue and white pixel regions Rp, Gp, Bp and Wp. The TFT Tr can include a semiconductor layer, a gate electrode over the semiconductor layer and source and drain electrodes over the gate electrode. The source and drain electrodes can be spaced apart from each other and can be connected to the semiconductor layer.

In addition, a switching element electrically connected to the TFT Tr, the gate line and the data line and a storage capacitor connected to the switching element and the power line can be formed in each of the red, green, blue and white pixel regions Rp, Gp, Bp and Wp. When the switching element is turned on according to a gate signal of the gate line, the data signal of the data line is applied to the gate electrode of the TFT Tr of a driving element and one electrode of the storage capacitor through the switching element.

When the TFT Tr is turned on according to the data signal applied to the gate electrode, a current proportional to the data signal flows from the power line to the LED 640 through the TFT Tr of the driving element, and the LED 640 emits a light proportional to the current flowing through the TFT Tr.

The color filter layer 620 is disposed on or over the inner surface of the first substrate 610 and includes red, green and blue color filter patterns 622, 624 and 626 corresponding to the red, green and blue pixel regions Rp, Gp and Bp, respectively. Since a white-colored light emitted from the LED 640 passes the red, green and blue color filter patterns 622, 624 and 626, red-colored, green-colored and blue-colored lights are displayed through the first substrate 610 in the red, green and blue pixel regions Rp, Gp and Bp, respectively. In the white pixel region Wp, the white-colored light from the LED 640 is displayed through the first substrate 610.

The red color filter pattern 622 includes a red pigment or a red dye. When a white-colored light is incident to the red color filter pattern 622, the red color filter pattern 622 absorbs a light of a green wavelength band and a blue wavelength band and transmits a light of red wavelength band. The green color filter pattern 624 includes a green pigment or a green dye. When a white-colored light is incident to the green color filter pattern 624, the green color filter pattern 624 absorbs a light of a blue wavelength band and a red wavelength band and transmits a light of green wavelength band. The blue color filter pattern 626 includes a blue pigment or a blue dye. When a white-colored light is incident to the blue color filter pattern 626, the blue color filter pattern 626 absorbs a light of a red wavelength band and a green wavelength band and transmits a light of blue wavelength band.

When only the color filter layer 620 is formed between the first substrate 610 and the LED 620, only a light of a specific wavelength band among the white-colored light from the LED 640 passes the red, green and blue pixel regions Rp, Gp and Bp. For example, only the light of the red wavelength band passes the red pixel region Rp, only the light of the green wavelength band passes the green pixel region Gp, and only the light of the blue wavelength band passes the blue pixel region Bp. As a result, a light efficiency is reduced.

To improve the above disadvantage, a light converting layer 630 including a luminous body 100a and 100b according to a third embodiment of the present disclosure is formed on the color filter layer 620. The light converting layer 630 includes a red light converting layer 632 on the red color filter pattern 622 corresponding to the red pixel region Rp and a green light converting layer 634 on the green color filter pattern 624 corresponding to the green pixel region Gp. When the white-colored light is emitted from the LED 640, the light converting layer 630 is formed in the red pixel region Rp and the green pixel region Gp, and the light converting layer 630 is not formed in the blue pixel region Bp and the white pixel region Wp.

The red light converting layer 632 includes a red luminous body 100a having a red first moiety 110a of a red inorganic emitting particle and a second moiety 120 connected to the red first moiety 110a and including silsesquioxanes at an end thereof. For example, since the red light converting layer 632 includes a red inorganic emitting particle 111 (of FIG. 2) emitting a red-colored light, the red light converting layer 632 can convert the light emitted from the LED 640 into the light of the red wavelength band where a peak wavelength is within a range of about 600 nm to about 640 nm.

The green light converting layer 634 includes a green luminous body 100b having a green first moiety 110b of a green inorganic emitting particle and a second moiety 120 connected to the green first moiety 110b and including silsesquioxanes at an end thereof. For example, since the green light converting layer 634 includes a green inorganic emitting particle 111 (of FIG. 2) emitting a green-colored light, the green light converting layer 634 can convert the light emitted from the LED 640 into the light of the green wavelength band where a peak wavelength is within a range of about 500 nm to about 570 nm.

While the white-colored light emitted from the LED 640 passes the red light converting layer 632 corresponding to the red pixel region Rp, the green-colored and blue-colored lights having a wavelength shorter than the red-colored light among the white-colored light are converted into the red-colored light. Since most of the white-colored light emitted from the LED 640 in the red pixel region Rp is converted into the red-colored light and then passes the red color filter pattern 622, an amount of the light absorbed by the red color filter pattern 622 is reduced and a light efficiency is improved.

While the white-colored light emitted from the LED 640 passes the green light converting layer 634 corresponding to the green pixel region Gp, the blue-colored light having a wavelength shorter than the green-colored light among the white-colored light is converted into the green-colored light. Since considerable portion of the white-colored light emitted from the LED 640 in the green pixel region Gp is converted into the green-colored light and then passes the green color filter pattern 624, an amount of the light absorbed by the green color filter pattern 624 is reduced and a light efficiency is improved.

The light converting layer 630 is not formed in the blue pixel region Bp. In general, it is difficult to convert a light having a relatively low energy (a light of a long wavelength) into a light having a relatively high energy (a light of a short wavelength). Since the light having a relatively high energy is emitted in the blue pixel region Bp, it is difficult to convert the white-colored light into the blue-colored light through the light converting layer 630 in the blue pixel region Bp. As a result, the light converting layer 630 is not formed in the blue pixel region Bp. While the white-colored light emitted from the LED 640 passes the blue color filter pattern 626 in the blue pixel region Bp, the blue color filter pattern 626 absorbs the light having a wavelength other than the blue wavelength band and transmits the blue-colored light.

The color filter layer 620 and the light converting layer 630 are not formed in the white pixel region Wp. As a result, the white-colored light emitted from the LED 640 passes the white pixel region Wp intactly.

In the OLED display device 600 according to the third embodiment of the present disclosure, the red and green light converting layers 632 and 634 are formed in the red and green pixel regions Rp and Gp, respectively. While the white-colored light emitted from the LED 640 passes the red and green light converting layers 632 and 634, the white-colored light is converted into the red-colored and green-colored lights capable of passing the red and green color filter patterns 622 and 624. As a result, an amount of light absorbed by the red and green color filter patterns 622 and 624 is minimized and the light efficiency is improved.

Specifically, each of the red luminous body 100a of the red light converting layer 632 and the green luminous body 100b of the green light converting layer 634 includes the first ligand 116 (of FIG. 2) and the second ligand 122 (of FIG. 2). One of the first and second ligands 116 and 122 is a non-polar ligand and the other one of the first and second ligands 116 and 122 is a polar ligand. Accordingly, the red and green luminous bodies 100a and 100b can be stably dispersed to various polar solvents and various non-polar solvents.

After a dye or a pigment for the color filter layer 620 and a luminous body 100a and 100b for the light converting layer 630 are dispersed to a solvent to form a solution, the color filter layer 620 and the light converting layer 630 are sequentially formed through a soluble process using the solution. When the solvent for the color filter layer 620 and the solvent for the light converting layer 630 are the same as each other, the color filter layer 620 and the light converting layer 630 adjacent to each other can be mixed and a required optical extraction efficiency is not obtained.

For example, when an inorganic emitting particle including only a non-polar ligand is formed through a soluble process, the inorganic emitting particle can be dispersed only to a non-polar solvent. In addition, when a color element such as a dye or a pigment is dispersed only to a non-polar solvent, the inorganic emitting body of a single ligand for the light converting layer 630 and the color element for the color filter layer 620 can be mixed during the soluble process using the same non-polar solvent. Since the color element for the color filter layer 620 is formed in the light converting layer 630 and the inorganic emitting particle of a single ligand is formed in the color filter layer 620, the color filter layer 620 and the light converting layer 630 do not function adequately.

When the color filter layer 620 and the light converting layer 630 are formed through a soluble process, the color filter layer 620 and the light converting layer 630 are formed using orthogonal solvents, respectively, such that the color element for the color filter layer 620 and the inorganic emitting particle for the light converting layer 630 are not mixed. However, when the inorganic emitting particle for the light converting layer 630 is dispersed only to a non-polar solvent, a kind of the solvent for the light converting layer 630 is limited. As a result, when the color element for the color filter layer 620 is dispersed to the non-polar solvent used for the light converting layer 630, a material for the color filter layer 620 and a material for the light converting layer 630 are mixed such that the color filter layer 620 and the light converting layer 630 are not clearly divided.

In the OLED display device 600 according to the third embodiment of the present disclosure, since the red and green luminous bodies 100a and 100b for the light converting layer 630 are stably dispersed to various polar solvents and various non-polar solvents, the color filter layer 620 can be formed by using a solvent different from the solvent for the light converting layer 630. Since the color element for the color filter layer 620 is not dispersed and the red and green luminous bodies 100a and 100b are dispersed, the light converting layer 630 is easily formed without mixing of the material for the color filter layer 620 and the material for the light converting layer 630. In addition, since silsesquioxanes 124 (of FIG. 2) having a bulky property is combined to an outermost portion of the red and green luminous bodies 100a and 100b, the two inorganic emitting particles 111 are not disposed within a predetermined distance. As a result, an FRET phenomenon is prevented and an excellent emission property is obtained.

Although the LED 640 emits the white-colored light in FIG. 7, the light emitted from the LED 640 is not limited to a white color. For example, the LED 640 can emit a blue-colored light, and the color filter layer 620 can include red and green color filter patterns 622 and 624 corresponding to red and green pixel regions Rp and Gp, respectively. The light converting layer 630 can include a red light converting layer 632 over the red color filter pattern 622 corresponding to the red pixel region Rp, a green light converting layer 634 over the green color filter pattern 624 corresponding to the green pixel region Gp and a white light converting layer corresponding to the white pixel region Wp. The red light converting layer 632 can include a red luminous body 100a having a red first moiety 110a of a red inorganic emitting particle and a second moiety 120 connected to the red first moiety 110a and including silsesquioxanes at an end thereof. The green light converting layer 634 can include a green luminous body 100b having a green first moiety 110b of a green inorganic emitting particle and a second moiety 120 connected to the green first moiety 110b and including silsesquioxanes at an end thereof. The white light converting layer can include the red and green luminous bodies.

In the red pixel region Rp, while the blue-colored light emitted from the LED 640 passes the red light converting layer 632, the blue-colored light is converted into a red-colored light and the red-colored light passes the red color filter pattern 622 intactly. The blue-colored light which is not converted into the red-colored light by the red light converting layer 632 can be absorbed by the red color filter pattern 622.

In the green pixel region Gp, while the blue-colored light emitted from the LED 640 passes the green light converting layer 634, the blue-colored light is converted into a green-colored light and the green-colored light passes the green color filter pattern 624 intactly. The blue-colored light which is not converted into the green-colored light by the green light converting layer 634 can be absorbed by the green color filter pattern 624.

In the blue pixel region Bp, since the blue-colored light of the LED 640 is emitted intactly, the color filter layer 620 and the light converting layer 630 are not formed.

In the white pixel region Wp, while the blue-colored light emitted from the LED 640 passes the white light converting layer including the red and green luminous bodies, the blue-colored light is converted into a light of red and green wavelength bands. Since the color filter layer is not formed in the white pixel region Wp, the light of the red and green wavelength bands and the blue-colored light which is not converted by the white light converting layer are mixed to emit a white-colored.

A planarizing layer 636 is formed on the red and green light converting layers 632 and 634 in the red and green pixel regions Rp and Gp, the blue color filter pattern 626 in the blue pixel region Bp and the TFT Tr in the white pixel region Wp. The planarizing layer 636 is formed on a whole of the first substrate 610 to planarize a surface of the first substrate 610. The planarizing layer 636 can include an inorganic insulating material such as silicon oxide ($SiO_2$) and silicon nitride ($SiN_x$) or an organic insulating material such as photo acryl.

The LED 640 is disposed on the planarizing layer 636 and includes a first electrode 642, a second electrode 646 and an emitting layer 644 between the first and second electrodes 642 and 646. For example, the LED 640 can be an organic light emitting diode or an inorganic light emitting diode such as a quantum dot light emitting diode.

The first electrode 642 is disposed on the planarizing layer 636 and is divided into each of the red, green, blue and white pixel regions Rp, Gp, Bp and Wp. The first electrode 642 is connected to the TFT Tr. The first electrode 642 can be an anode and can include a conductive material having a relatively high work function. For example, the first electrode 642 can include a metal oxide doped or not such as indium-tin-oxide (ITO), indium-zinc-oxide (IZO), indium-tin-zinc oxide (ITZO), indium-copper-oxide (ICO), tin oxide ($SnO_2$), indium oxide ($In_2O_3$), cadmium:zinc oxide (Cd:ZnO), fluorine:tin oxide ($F:SnO_2$), indium:tin oxide (In:$SnO_2$), gallium:tin oxide ($Ga:SnO_2$) and aluminum:zinc oxide (Al:ZnO; AZO).

The emitting layer 644 is disposed on the first electrode 642 and emit a white-colored light or a blue-colored light. Although the LED 640 includes the emitting layer 644 of a single layer between the first and second electrodes 642 and 646 in FIG. 7, the LED 640 can include a plurality of emitting units between the first and second electrodes 642 and 646 in another embodiment.

For example, the emitting layer 646 can include a first emitting unit, a charge generation layer (CGL) and a second emitting unit sequentially on the first electrode 642. The first emitting unit can include a hole injection layer (HIL), a first hole transport layer (HTL), a first emitting material layer (EML) and a first electron transport layer (ETL) and the second emitting unit can include a second hole transport layer (HTL), a second emitting material layer (EML), a second electron transport layer (ETL) and an electron injection layer (EIL). One of the first and second EMLs can emit a blue-colored light and the other one of the first and second EMLs can emit a green-colored light, a yellow-green-colored light or an orange-colored light such that the LED 640 emits a white-colored light.

The emitting layer 644 can be formed on a whole of the display area including the red, green, blue and white pixel regions Rp, Gp, Bp and Wp as one body. Alternatively, the emitting layer 644 can be divided into each of the red, green, blue and white pixel regions Rp, Gp, Bp and Wp.

The second electrode 646 is disposed on the emitting layer 644 and is formed on a whole of the display area including the red, green, blue and white pixel regions Rp, Gp, Bp and Wp as one body. The second electrode 646 can be a cathode and can include a conductive material having a relatively low work function. For example, the second electrode 646 can include one of calcium (Ca), barium (Ba), calcium/aluminum (Ca), lithium fluoride/calcium (LiF/Ca), lithium fluoride/aluminum (LiF/Al), barium fluoride/aluminum ($BaF_2$/Al), cesium fluoride/aluminum (CsF/Al), calcium carbonate/aluminum ($CaCO_3$/Al), barium fluoride/calcium/aluminum ($BaF_2$/Ca/Al), aluminum (Al), magnesium (Mg), aluminum/magnesium (Al/Mg), gold:magnesium (Au:Mg) and silver:magnesium (Ag:Mg).

A bank layer 648 covering an edge portion of the first electrode 642 is formed under the emitting layer 644. The bank layer 648 can be omitted in another embodiment.

When a voltage is applied to the LED 640, the white-colored light is emitted from the LED 640 and the white-colored light is displayed as an image on the first substrate 610 through the light converting layer 630 and the color filter layer 620. As a result, the OLED display device 600 according to a third embodiment of the present disclosure has a bottom emission type.

In the OLED display device 600 according to the third embodiment of the present disclosure, since the light converting layer 630 converting the light of the LED 640 into a light of a predetermined wavelength band is formed between the color filter layer 620 and the LED 640, an amount of light absorbed by the color filter layer 620 is minimized and the light efficiency is improved. Specifically, since the luminous bodies 100a and 100b for the light converting layer 630 are stably dispersed to various non-polar solvents and various polar solvents, mixing of the dye or the pigment for the color filter layer 620 and the luminous bodies 100a and 100b for the light converting layer 630 in the soluble process is prevented. Since silsesquioxanes 124 (of FIG. 2) having a bulky property is disposed at an outer portion of the luminous bodies 100a and 100b, an FRET phenomenon is prevented and an excellent emission property such as an excellent emission luminance is obtained.

Although the luminous body is applied to the bottom emission type OLED display device 600 is shown in FIG. 7, the luminous body can be applied to a top emission type OLED display device in another embodiment and other variations are possible.

Figure 8:
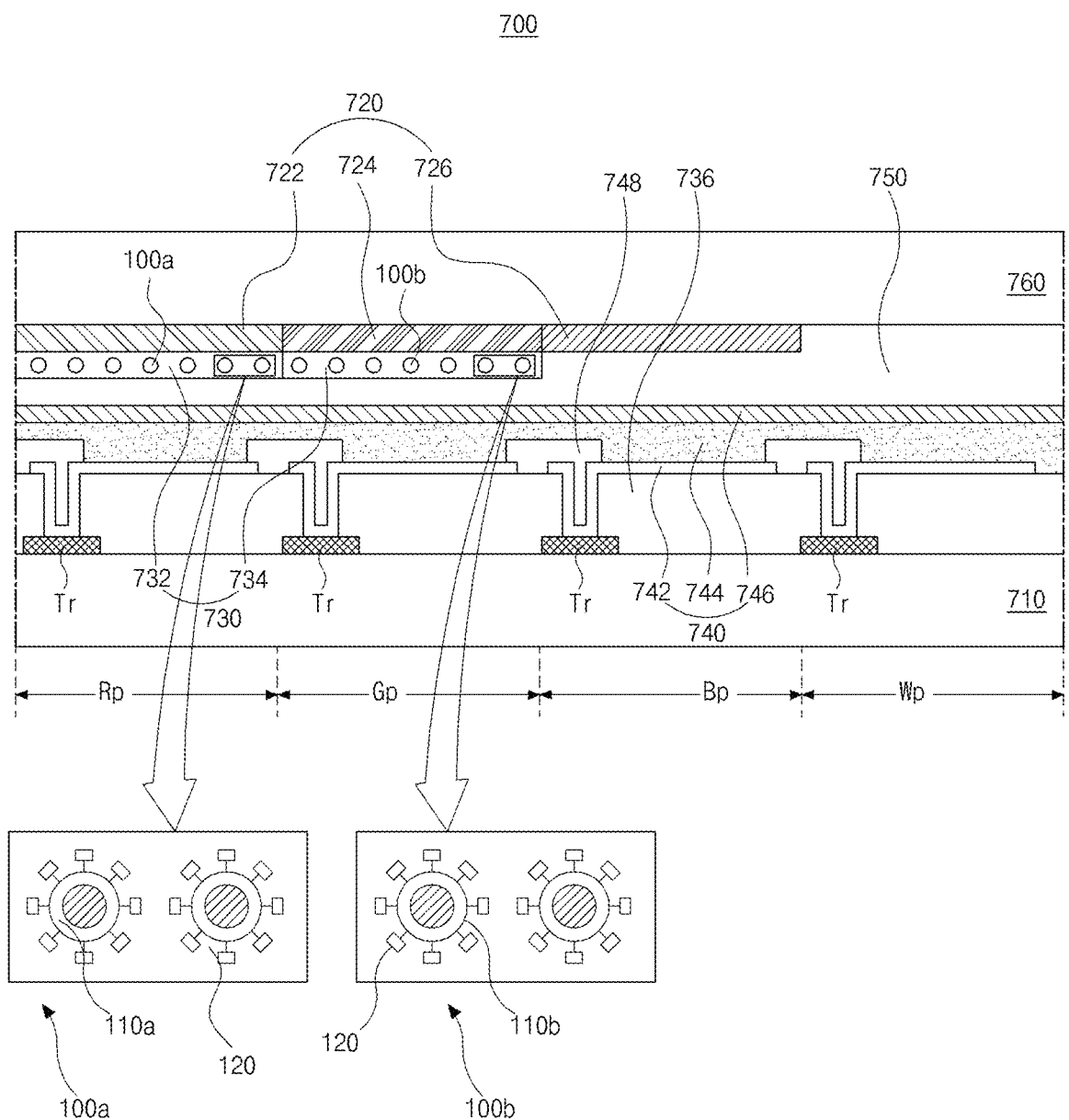
FIG. 8 is a cross-sectional view showing a light emitting device having a luminous body according to a fourth embodiment of the present disclosure.

FIG. 8 is a cross-sectional view showing a light emitting device having a luminous body according to a fourth embodiment of the present disclosure. As an example, the light emitting device is a white organic light emitting diode display device of a top emission type.

In FIG. 8, an organic light emitting diode (OLED) display device 700 according to the fourth embodiment of the present disclosure includes a first substrate 710 where red, green, blue and white pixel regions Rp, Gp, Bp and Wp are defined, a second substrate 760 facing the first substrate 710, a light emitting diode (LED) 740 between the first and second substrates 710 and 760, a color filter layer 720 between the LED 740 and the second substrate 760 and a light converting layer 730 between the color filter layer 720 and the LED 740. The color filter layer 720 corresponds to the red, green and blue pixel regions Rp, Gp and Bp, and the light converting layer 730 correspond to the red and green pixel regions Rp and Gp.

The first substrate 710 can include a transparent material. For example, the first substrate 710 can include a plastic such as polyimide or a glass. The second substrate 760 can include a transparent material or an opaque material. For example, the second substrate 760 can include a glass, a plastic such as polyimide or a metal foil.

An adhesive layer 750 is disposed between the second substrate 760 and the LED 740, e.g., between the color filter layer 720 and the LED 740 or between the light converting layer 730 and the LED 740, and a barrier layer can be formed on the LED 740 and the adhesive layer 750 to prevent penetration of external moisture.

A thin film transistor (TFT) Tr of a driving element is disposed in each of the red, green, blue and white pixel regions Rp, Gp, Bp and Wp. The TFT Tr can include a semiconductor layer, a gate electrode over the semiconductor layer and source and drain electrodes over the gate electrode. The source and drain electrodes can be spaced apart from each other and can be connected to the semiconductor layer.

A planarizing layer is formed on the TFT Tr. The planarizing layer can include an inorganic insulating material such as silicon oxide ($SiO_2$) and silicon nitride (SiNx) or an organic insulating material such as photo acryl.

The LED 740 is disposed on the planarizing layer and includes a first electrode 742, a second electrode 746 and an emitting layer 744 between the first and second electrodes 742 and 746. For example, the LED 740 can be an organic light emitting diode or an inorganic light emitting diode such as a quantum dot light emitting diode. A bank layer 748 covering an edge portion of the first electrode 742 is formed under the emitting layer 744. The bank layer 748 can be omitted in another embodiment.

When a voltage is applied to the LED 740, the white-colored light is emitted from the LED 740 and the white-colored light is displayed as an image on the second substrate 760 through the light converting layer 730 and the color filter layer 720. As a result, the OLED display device 700 according to a fourth embodiment of the present disclosure has a top emission type.

The color filter layer 720 is disposed on or over the inner surface of the second substrate 760 and includes red, green and blue color filter patterns 722, 724 and 726 corresponding to the red, green and blue pixel regions Rp, Gp and Bp, respectively. Since a white-colored light emitted from the LED 740 passes the red, green and blue color filter patterns 722, 724 and 726, red-colored, green-colored and blue-colored lights are displayed through the second substrate 760 in the red, green and blue pixel regions Rp, Gp and Bp, respectively. In the white pixel region Wp, the white-colored light from the LED 740 is displayed through the second substrate 760.

The red color filter pattern 722 includes a red pigment or a red dye. When a white-colored light is incident to the red color filter pattern 722, the red color filter pattern 722 absorbs a light of a green wavelength band and a blue wavelength band and transmits a light of red wavelength band. The green color filter pattern 724 includes a green pigment or a green dye. When a white-colored light is incident to the green color filter pattern 724, the green color filter pattern 724 absorbs a light of a blue wavelength band and a red wavelength band and transmits a light of green wavelength band. The blue color filter pattern 726 includes a blue pigment or a blue dye. When a white-colored light is incident to the blue color filter pattern 726, the blue color filter pattern 726 absorbs a light of a red wavelength band and a green wavelength band and transmits a light of blue wavelength band.

To prevent reduction in a light efficiency due to transmission of a light of a specific wavelength band through the red, green and blue color filter patterns 722, 724 and 726 the above disadvantage, a light converting layer 730 including a luminous body 100a and 100b is formed on the color filter layer 720. The light converting layer 730 includes a red light converting layer 732 on the red color filter pattern 722 corresponding to the red pixel region Rp and a green light converting layer 734 on the green color filter pattern 724 corresponding to the green pixel region Gp. When the white-colored light is emitted from the LED 740, the light converting layer 730 is formed in the red pixel region Rp and the green pixel region Gp, and the light converting layer 730 is not formed in the blue pixel region Bp and the white pixel region Wp.

The red light converting layer 732 includes a red luminous body 100a having a red first moiety 110a of a red inorganic emitting particle and a second moiety 120 connected to the red first moiety 110a and including silsesquioxanes at an end thereof. Since the red light converting layer 732 includes a red inorganic emitting particle 111 (of FIG. 2) emitting a red-colored light, the red light converting layer 732 can convert the light emitted from the LED 740 into the light of the red wavelength band.

The green light converting layer 734 includes a green luminous body 100b having a green first moiety 110b of a green inorganic emitting particle and a second moiety 120 connected to the green first moiety 110b and including silsesquioxanes at an end thereof. Since the green light converting layer 734 includes a green inorganic emitting particle 111 (of FIG. 2) emitting a green-colored light, the green light converting layer 734 can convert the light emitted from the LED 740 into the light of the green wavelength band.

While the white-colored light emitted from the LED 740 passes the red light converting layer 732 corresponding to the red pixel region Rp, the green-colored and blue-colored lights having a wavelength shorter than the red-colored light among the white-colored light are converted into the red-colored light. Since most of the white-colored light emitted from the LED 740 in the red pixel region Rp is converted into the red-colored light and then passes the red color filter pattern 722, an amount of the light absorbed by the red color filter pattern 722 is reduced and a light efficiency is improved.

While the white-colored light emitted from the LED 740 passes the green light converting layer 734 corresponding to the green pixel region Gp, the blue-colored light having a wavelength shorter than the green-colored light among the white-colored light is converted into the green-colored light. Since considerable portion of the white-colored light emitted from the LED 740 in the green pixel region Gp is converted into the green-colored light and then passes the green color filter pattern 724, an amount of the light absorbed by the green color filter pattern 724 is reduced and a light efficiency is improved.

The light converting layer 730 is not formed in the blue pixel region Bp. Since the light having a relatively high energy is emitted in the blue pixel region Bp, it is difficult to convert the white-colored light into the blue-colored light through the light converting layer 730 in the blue pixel region Bp. As a result, the light converting layer 730 is not formed in the blue pixel region Bp. While the white-colored light emitted from the LED 740 passes the blue color filter pattern 726 in the blue pixel region Bp, the blue color filter pattern 726 absorbs the light having a wavelength other than the blue wavelength band and transmits the blue-colored light.

The color filter layer 720 and the light converting layer 730 are not formed in the white pixel region Wp. As a result, the white-colored light emitted from the LED 740 passes the white pixel region Wp intactly.

In the OLED display device 700 according to the fourth embodiment of the present disclosure, the red and green light converting layers 732 and 734 are formed in the red and green pixel regions Rp and Gp, respectively. While the white-colored light emitted from the LED 740 passes the red and green light converting layers 732 and 734, the white-colored light is converted into the red-colored and green-colored lights capable of passing the red and green color filter patterns 722 and 724. As a result, an amount of light absorbed by the red and green color filter patterns 722 and 724 is minimized and the light efficiency is improved.

Specifically, each of the red luminous body 100a of the red light converting layer 732 and the green luminous body 100b of the green light converting layer 734 includes the first ligand 116 (of FIG. 2) and the second ligand 122 (of FIG. 2). One of the first and second ligands 116 and 122 is a non-polar ligand and the other one of the first and second ligands 116 and 122 is a polar ligand. Accordingly, the red and green luminous bodies 100a and 100b can be stably dispersed to various polar solvents and various non-polar solvents. When the color filter layer 720 is formed, the luminous bodies 100a and 100b can be dispersed to a solvent different from the solvent for the light converting layer 730, and mixing of a material for the color filter layer 720 and a material for the light converting layer 730 can be prevented. In addition, since silsesquioxanes 124 (of FIG. 2) having a bulky property is disposed at an outer portion of the red and green luminous bodies 100a and 100b, the two inorganic emitting particles 111 (of FIG. 2) are not disposed within a predetermined distance, and an FRET phenomenon is prevented to obtain an excellent emission property.

Similarly to FIG. 7, the LED 740 can emit a blue-colored light, and the color filter layer 720 can include red and green color filter patterns 722 and 724 corresponding to red and green pixel regions Rp and Gp, respectively. The light converting layer 730 can include a red light converting layer 732 over the red color filter pattern 722 corresponding to the red pixel region Rp, a green light converting layer 734 over the green color filter pattern 724 corresponding to the green pixel region Gp and a white light converting layer corresponding to the white pixel region Wp.

The red light converting layer 732 can include a red luminous body 100a having a red first moiety 110a of a red inorganic emitting particle and a second moiety 120 connected to the red first moiety 110a and including silsesquioxanes at an end thereof. The green light converting layer 734 can include a green luminous body 100b having a green first moiety 110b of a green inorganic emitting particle and a second moiety 120 connected to the green first moiety 110b and including silsesquioxanes at an end thereof. The white light converting layer can include the red and green luminous bodies.

In the OLED display device 700 according to the fourth embodiment of the present disclosure, the optical efficiency and the emission property are improved due to the light converting layer 730.

[Inorganic Light Emitting Diode And Light Emitting Device]

Since the luminous body according the a first embodiment of the present disclosure is dispersed to various solvents and has an excellent emission property for various wavelength bands, the luminous body can be applied to an inorganic light emitting diode such as a quantum dot light emitting diode.

Figure 9:
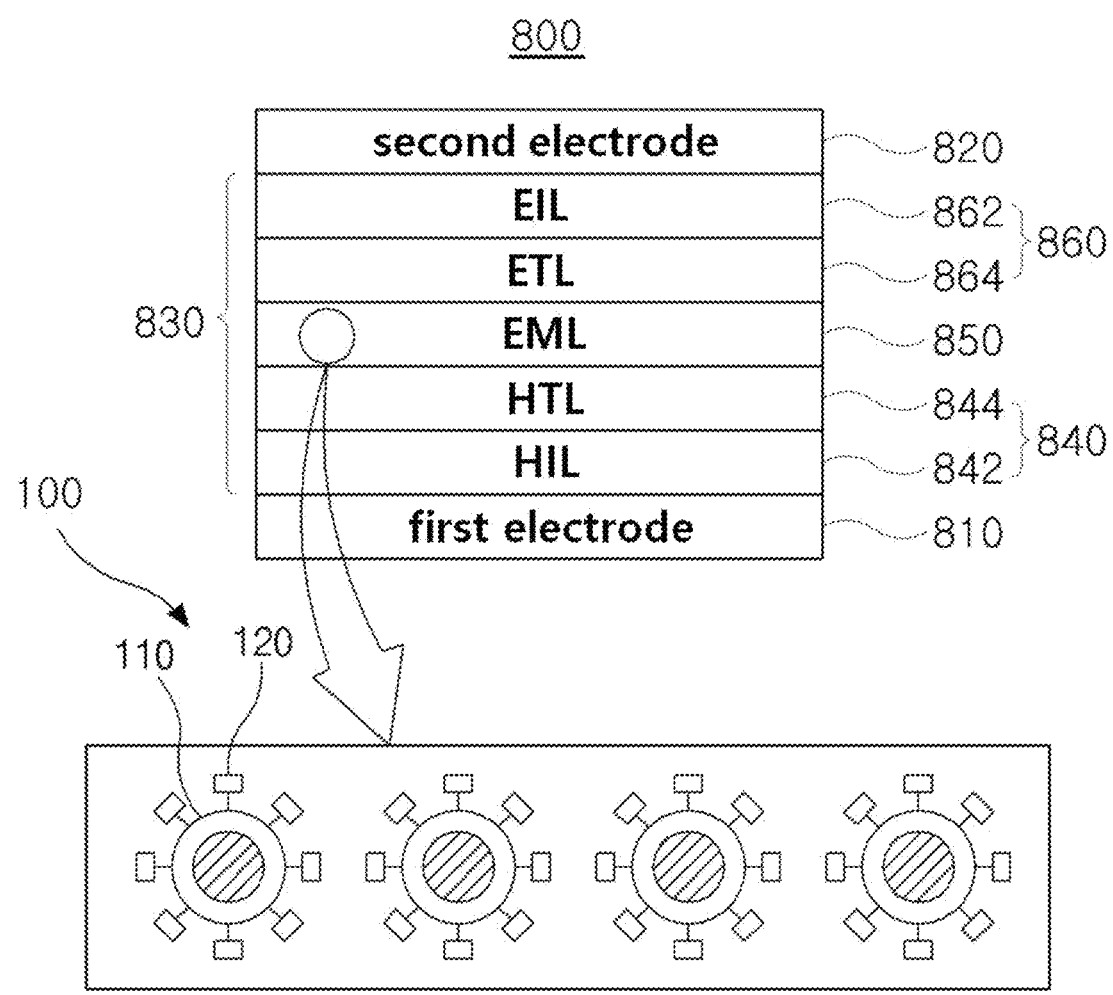
FIG. 9 is a cross-sectional view showing an inorganic light emitting diode including a luminous body according to a fifth embodiment of the present disclosure.

FIG. 9 is a cross-sectional view showing an inorganic light emitting diode including a luminous body according to a fifth embodiment of the present disclosure. As an example, the inorganic light emitting diode has a normal structure and an emitting material layer includes the luminous body. All the components of the inorganic light emitting diodes according to all embodiments of the present disclosure are operatively coupled and configured.

In FIG. 9, an inorganic light emitting diode (LED) 800 according to the fifth embodiment of the present disclosure includes a first electrode 810, a second electrode 820 facing the first electrode 810 and an emitting layer 830 including an emitting material layer (EML) 850 between the first and second electrodes 810 and 820. For example, the emitting layer 830 can further include a first charge moving layer 840 between the first electrode 810 and the EML 850 and a second charge moving layer 860 between the EML 850 and the second electrode 820.

The first electrode 810 can be an anode such as a hole injecting electrode. The first electrode 810 can be formed on a substrate of a glass or a polymer. For example, the first electrode 810 can include a metal oxide doped or not such as indium-tin-oxide (ITO), indium-zinc-oxide (IZO), indium-tin-zinc oxide (ITZO), indium-copper-oxide (ICO), tin oxide ($SnO_2$), indium oxide ($In_2O_3$), cadmium:zinc oxide (Cd:ZnO), fluorine:tin oxide (F:$SnO_2$), indium:tin oxide (In:$SnO_2$), gallium:tin oxide (Ga:$SnO_2$) and aluminum:zinc oxide (Al:ZnO; AZO). Selectively, the first electrode 810 can include a metallic material or a non-metallic material such as nickel (Ni), platinum (Pt), gold (Au), silver (Ag), iridium (Ir) or carbon nano tube (CNT).

The second electrode 820 can be a cathode such as an electron injecting electrode. The second electrode 820 can include one of calcium (Ca), barium (Ba), calcium/aluminum (Ca/Al), lithium fluoride/calcium (LiF/Ca), lithium fluoride/aluminum (LiF/Al), barium fluoride/aluminum ($BaF_2$/Al), cesium fluoride/aluminum (CsF/Al), calcium carbonate/aluminum ($CaCO_3$/Al), barium fluoride/calcium/aluminum ($BaF_2$/Ca/Al), aluminum (Al), magnesium (Mg), gold:magnesium (Au:Mg) and silver:magnesium (Ag:Mg). For example, each of the first and second electrodes 810 and 820 can have a thickness of about 30 nm to about 300 nm.

When the inorganic LED 800 has a bottom emission type, the first electrode 810 can include a transparent conductive material such as ITO, IZO, ITZO and AZO, and the second electrode 820 can include a material such as Ca, Ba, Ca/Al, LiF/Ca, LiF/Al, Al, Mg and Ag:Mg.

The first charge moving layer 840 of the emitting layer 830 is disposed between the first electrode 810 and the EML 850. The first charge moving layer 840 can include a hole moving layer supplying a hole to the EML 850. For example, the first charge moving layer 840 can include a hole injection layer (HIL) 842 between the first electrode 810 and the EML 850 and a hole transport layer (HTL) 844 between the HIL 842 and the EML 850.

The HIL 842 assists injection of a hole from the first electrode 810 to the EML 850. For example, the HIL 842 can include an organic material selected from a group including poly(ethylenedioxythiophene):polystyrenesulfonate (PEDOT:PSS), 4,4',4"-tris(diphenylamino)triphenylamine (TDATA) doped with tetrafluoro-tetracyano-quinodimethane (F4-TCNQ) (e.g., p-doped phthalocyanine such as zinc phthalocyanine (ZnPc) doped with F4-TCNQ, N,N'-diphenyl-N,N'-bis(1-naphtyl)-1,1'-biphenyl-4,4"-diamine (α-NPD) doped with F4-TCNQ, hexaazatriphenylene-hexanitrile (HAT-CN) and a combination thereof. For example, a dopant such as F4-TCNQ can be doped by about 1 wt % to about 30 wt % with respect to a host. The HIL 842 can be omitted according to a structure and a shape of the inorganic LED 800.

The HTL 844 assists transport of a hole from the first electrode 810 to the EML 850. The HTL 844 can include an inorganic material or an organic material. For example, the HTL 844 can include an organic material selected from a group including 4,4'-N,N'-dicarbazolyl-biphenyl (CBP), N,N'-diphenyl-N,N'-bis(1-naphtyl)-1,1'-biphenyl-4,4"-diamine (α-NPD), N,N'-diphenyl-N,N'-bis(3-methylphenyl)-(1,1'-biphenyl)-4,4'-diamine (TPD), N,N'-bis(3-methylphenyl)-N,N'-bis(phenyl)-spiro (spiro-TPD), N,N'-di(4-(N,N'-diphenyl-amino)phenyl)-N,N'-diphenylbenzidine (DNTPD), arylamine such as 4,4',4"-tris(N-carbazolyl)-triphenylamine (TCTA), polyaniline, polypyrrole, poly(phenylenevinylene), copper phthalocyanine, aromatictertiary amine, polynuclear aromatic tertiary amine, 4,4'-bis(p-carbazolyl)-1,1'-biphenyl compound, N,N,N',N'-tetraarylbenzidine, PEDOT:PSS and derivatives thereof, poly(N-vinylcarbazole) (PVK) and derivatives thereof, poly(p) phenylenevinylene and derivatives thereof such as poly[2-methoxy-5-(2-ethylhexyloxy)-1,4-phenylenevinylene] (MEH-PPV) or poly[2-methoxy-5-(3',7'-dimethyloctyloxy)-1,4-phenylenevinylene] (MOMO-PPV), polymethacrylate and derivatives thereof, poly(9,9-octylfluorene) and derivatives thereof, poly(spiro-fluorene) and derivatives thereof, N,N'-di(naphthalene-1-yl)-N,N'-diphenyl-benzidine (NPB), tris(3-methylphenylphenylamino)-triphenylamine (m-MTDATA), poly(9,9'-dioctylfluorenyl-2,7-diyl)-co-(4,4'-(N-(4-sec-butylphenyl)diphenylamine)) (TFB), poly(4-butylphenyl-dipnehyl amine) (poly-TPD), spiro-NPB and a combination thereof.

The HTL 844 can include an inorganic material selected from a group including a metal oxide such as nickel oxide (NiO), molybdenum oxide ($MoO_3$), chromium oxide ($Cr_2O_3$), bismuth oxide ($Bi_2O_3$) or p-type zinc oxide (ZnO) and a non-oxidized equivalent such as copper thiocyanate (CuSCN), molybdenum sulfide ($Mo_2S$) or p-type gallium nitride (GaN) and a combination thereof.

Although the first charge moving layer 840 is divided into the HIL 842 and the HTL 844 in FIG. 9, the first charge moving layer 840 can have a single layer in another embodiment. For example, the HIL 842 can be omitted and the first charge moving layer 840 can include only the HTL 844.

The first charge moving layer 840 including the HIL 842 and the HTL 844 can be formed through a vacuum deposition process such as a chemical vapor deposition method and a sputtering method or a soluble process such as a spin coating method, a drop coating method, a dip coating method, a spray coating method, a roll coating method, a flow coating method, a casting process, a screen printing method and an inkjet printing method singly or in combination. For example, each of the HIL 842 and the HTL 844 can have a thickness of about 10 nm to about 200 nm.

The EML 850 can include a luminous body 100. The luminous body 100 can include a first moiety 110 and a second moiety 120 connected to the first moiety 110. The first moiety 110 includes a first ligand ($L_1$) 116 (of FIG. 2) combined to a surface of an inorganic emitting particle 111 (of FIG. 2) and the second moiety 120 includes silsesquioxanes 124 (of FIG. 2) combined to a second ligand ($L_2$) 122 (of FIG. 2) connected to the first ligand 116. The inorganic emitting particle 111 constituting the first moiety 110 can have a heterologous structure of a core 112 (of FIG. 2) and a shell 114 (of FIG. 2). Since the inorganic emitting particle 111 of the first moiety 110 is used as a material for the EML 850, a color purity of each pixel region is improved and a white-colored light of red, green and blue emission of a high color purity is obtained.

The EML 850 can be formed through a soluble process of coating a dispersion solution where the luminous body 100 is dispersed to a solvent on the first charge moving layer 840 and drying the solvent. For example, the EML 850 can be formed through a soluble process such as a spin coating method, a drop coating method, a dip coating method, a spray coating method, a roll coating method, a flow coating method, a casting process, a screen printing method and an inkjet printing method singly or in combination.

The EML 850 can be formed by using inorganic emitting particles 111 having photoluminescence properties at 440 nm, 530 nm and 620 nm. For example, the EML 850 can include an inorganic emitting particle of a quantum dot or a quantum rod emitting one of a red-colored light, a green-colored light and a blue-colored light.

The luminous body 100 can include the first moiety 110 having the first ligand 116 and the second moiety 120 having the second ligand 122. One of the first and second ligands 116 and 122 is a non-polar ligand and the other one of the first and second ligands 116 and 122 is a polar ligand. As a result, the luminous body 100 can be uniformly dispersed to various polar solvents and various non-polar solvents.

The second charge moving layer 860 is disposed between the EML 850 and the second electrode 820. The second charge moving layer 860 can include an electron moving layer supplying an electron to the EML 850. For example, the second charge moving layer 860 can include an electron injection layer (EIL) 862 between the second electrode 820 and the EML 850 and an electron transport layer (ETL) 864 between the EIL 862 and the EML 850.

The EIL 862 assists injection of an electron from the second electrode 820 to the EML 850. For example, the EIL 862 can include a material of a metal such as aluminum (Al), cadmium (Cd), cesium (Cs), copper (Cu), gallium (Ga), germanium (Ge), indium (In) and lithium (Li) doped or combined with a fluorine (F) or a metal oxide such as titanium dioxide ($TiO_2$), zinc oxide (ZnO), zirconium (ZrO), tin dioxide ($SnO_2$), tungsten trioxide ($WO_3$) and tantalum oxide ($Ta_2O_3$) doped with aluminum (Al), magnesium (Mg), indium (In), lithium (Li), gallium (Ga), cadmium (Cd), cesium (Cs) and copper (Cu) or not doped.

The ETL 864 assists transport of an electron from the second electrode 820 to the EML 850. The ETL 864 can include an inorganic material and/or an organic material. For example, the ETL 864 can include an inorganic material selected from a group including a metal/non-metal oxide such as titanium dioxide ($TiO_2$), zinc oxide (ZnO), zinc magnesium oxide (ZnMgO), zirconium (ZrO), tin dioxide ($SnO_2$), tungsten trioxide ($WO_3$), tantalum oxide ($Ta_2O_3$), hafnium trioxide ($HfO_3$), aluminum oxide ($Al_2O_3$), zirconium silicon oxide ($ZrSiO_4$), barium titanium oxide ($BaTiO_3$) and barium zirconium oxide ($BaZrO_3$) doped with aluminum (Al), magnesium (Mg), indium (In), lithium (Li), gallium (Ga), cadmium (Cd), cesium (Cs) and copper (Cu) or not doped, a semiconductor particle such as cadmium sulfide (CdS), zinc selenide (ZnSe) and zinc sulfide (ZnS) doped with aluminum (Al), magnesium (Mg), indium (In), lithium (Li), gallium (Ga), cadmium (Cd), cesium (Cs) and copper (Cu) or not doped and a nitride material such as silicon nitride ($Si_3N_4$) and a combination thereof.

The ETL 864 can include an organic material such as an oxazole compound, an isoxazole compound, a triazole compound, an isothiazole compound, an oxadiazole compound, a thiadizaole compound, a phenanthroline compound, a perylene compound, a benzoxazole compound, a benzothiazole compound, a benzimidazole compound, a pyrene compound, a triazine compound and an aluminum complex. For example, the ETL 864 can be selected from a group including 3-(biphenyl-4-yl)-5-(4-tertbutylphenyl)-4-phenyl-4H-1,2,4-triazole (TAZ), bathocuproine (2,9-dimethyl-4,7-diphenyl-1,10-phenanthroline) (BCP), 2,2',2"-(1,3,5-benzinetriyl)-tris(1-phenyl-1-H-benzimidazole (TPBi), 2-[4-(9,10-di-2-naphthalenyl-2-anthracenyl)phenyl]-1-phenyl-1H-benzimidazole), tris(8-hydroxyquinoline)aluminum ($Alq_3$), bis(2-methyl-8-quninolinato)-4-phenylphenolatealuminum (III) (Balq), bis(2-methyl-quninolinato) (triphenylsiloxy), 8-hydroxy-quinolinato lithium (Liq), bis(2-methyl-quinolinato) (triphenylsiloxy)aluminum(III) (Salq) and a combination thereof.

Similarly to the first charge moving layer 840, although the second charge moving layer 860 is divided into the EIL 862 and the ETL 864 in FIG. 9, the second charge moving layer 860 can have a single layer in another embodiment. For example, the second charge moving layer 860 can include a single layer of the ETL 864 where an inorganic material is blended with cesium carbonate.

The second charge moving layer 860 including the EIL 862 and/or the ETL 864 can be formed through a vacuum deposition process such as a chemical vapor deposition method and a sputtering method or a soluble process such as a spin coating method, a drop coating method, a dip coating method, a spray coating method, a roll coating method, a flow coating method, a casting process, a screen printing method and an inkjet printing method singly or in combination. For example, each of the EIL 862 and the ETL 864 can have a thickness of about 10 nm to about 200 nm, preferably about 10 nm to about 100 nm.

The emission property of the LED 800 can be improved by using a hybrid charge transport layer (CTL) including the HTL 844 of an organic material for the first charge moving layer 840 and the second charge moving layer 860 of an inorganic material.

When a hole moves to the second electrode 820 through the EML 850 or an electron moves to the first electrode 810 through the EML 850, a lifetime and an efficiency of the LED 800 can be reduced. To prevent the reduction in lifetime and efficiency, the LED 800 can further include at least one exciton blocking layer adjacent to the EML 850.

For example, an electron blocking layer (EBL) controlling and preventing movement of an electron can be formed between the HTL 844 and the EML 850.

The EBL can include one of TCTA, tris[4-(diethylamino) phenyl]amine, N-(biphenyl-4-il)-9,9-dimethyl-N-(4-(9-phenyl-9H-carbazole-3-il)phenyl)-9H-fluorene-2-amine, tri-p-tolylamine, 1,1-bis(4-(N,N'-di(ptolyl)amino)phenyl) cyclohexane; TAPC), m-MTDATA, 1,3-bis(N-carbazolyl) benzene (mCP), 3,3'-bis(N-carbazolyl)-1,1'-biphenyl (mCBP), poly-TPD, copper phthalocyanine (CuPc), DNTPD and/or 1,3,5-tris[4-(diphenylamino)phenyl]benzene (TDAPB).

In addition, a hole blocking layer (HBL) as a second exciton blocking layer can be formed between the EML 850 and the ETL 864 to prevent movement of a hole. The HBL can include a material for the ETL 864 such as an oxadiazole compound, a triazole compound, a phenanthroline compound, a benzoxazole compound, a benzothiazole compound, a benzimidazole compound, a triazine compound and a pyrene compound and derivatives thereof.

For example, the HBL can include one of 2,9-dimethyl-4,7-diphenyl-1,10-phenanthroline (BCP), BAlq, $Alq_3$, PBD, spiro-PBD and/or Liq which has a highest occupied molecular orbital (HOMO) energy level smaller than a material for the EML 850.

The inorganic emitting particle 111 of the first moiety 110 of the luminous body 100 can emit a light having various colors according to a component and an ingredient thereof, and a quantum efficiency can be improved by using the inorganic emitting particle 11 having a heterologous structure. Since the luminous body 100 includes silsesquioxanes 124 having a bulky property, an FRET phenomenon between the adjacent inorganic emitting particles 111 is prevented.

The first charge moving layer 840, the EML 850 and the second charge moving layer 860 can be formed through a soluble process using different solvents. When the same solvent dispersing and dissolving materials for the first charge moving layer 840, the EML 850 and the second charge moving layer 860 are used, the materials are mixed in the soluble process. As a result, an interface between layers becomes unclear and properties of light emission and charge movement are reduced.

The inorganic emitting particle of a non-polar single ligand can be dispersed to a non-polar solvent. When the inorganic emitting particle of a non-polar single ligand is formed through a soluble process, a non-polar solvent where a material for the first and second charge moving layers 840 and 860 is not dispersed and the inorganic emitting particle is dispersed is used. However, since a kind of the non-polar solvent is limited, the material for the first and second charge moving layers 840 and 860 can be dispersed to the non-polar solvent for the EML 850 during the soluble process. As a result, the interfaces between the first charge moving layer 840 and the EML 850 and between the EML 850 and the second charge moving layer 860 can become unclear, and the emission property and the charge movement property can be reduced due to mixing of the materials for the first charge moving layer 840, the EML 850 and the second charge moving layer 860.

However, since the luminous body 100 according to the fifth embodiment of the present disclosure is dispersed to various polar solvents and various non-polar solvents, an adequate orthogonal solvent where the material for the first and second charge moving layers 840 and 860 is not dispersed can be selected during the soluble process of forming the EML 850 including the luminous body 100. Since the luminous body 100 of the EML 850 is dispersed to the selected orthogonal solvent and the material for the first and second charge moving layers 840 and 860 is not dispersed to the selected orthogonal solvent, the material for the first and second charge moving layers 840 and 860 and the luminous body 100 are not mixed when the EML 850 is formed. As a result, the interfaces between the first charge moving layer 840 and the EML 850 and between the EML 850 and the second charge moving layer 860 can be clearly divided, and the emission property and the charge movement property can be improved.

The LED 800 of FIG. 9 has a normal structure where a hole moving layer is disposed between the first electrode 810 having a relatively low work function and the EML 850 and an electron moving layer is disposed between the second electrode 820 having a relatively high work function and the EML 850. The LED 800 can have an inverted structure in another embodiment.

In an inorganic LED of an inverted structure, the first electrode can be a cathode such as an electron injection electrode, and the second electrode can be an anode such as a hole injection electrode. The first charge moving layer can be an electron moving layer, and the second charge moving layer can be a hole moving layer. A hole blocking layer can be disposed between the EML and the first charge moving layer, and an electron blocking layer can be disposed between the EML and the second charge moving layer.

As a result, the inorganic LED including the EML having the luminous body can be applied to a lighting apparatus and a light emitting device such as a display device. A light emitting device including the LED having the EML of the luminous body will be illustrated.

Figure 10:
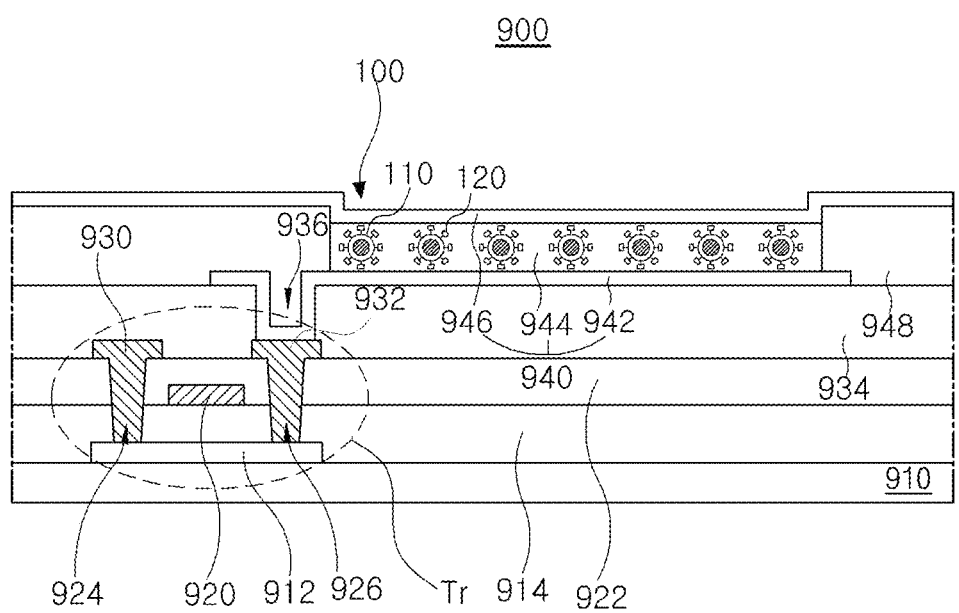
FIG. 10 is a cross-sectional view showing an inorganic light emitting diode display device according to a sixth embodiment of the present disclosure.

FIG. 10 is a cross-sectional view showing an inorganic light emitting diode display device according to a sixth embodiment of the present disclosure. All the components of the inorganic light emitting diode display devices according to all embodiments of the present disclosure are operatively coupled and configured.

In FIG. 10, an inorganic light emitting diode display device 900 according to the sixth embodiment of the present disclosure includes a first substrate 910, a thin film transistor (TFT) Tr of a driving element on the substrate 910 and an inorganic light emitting diode 940 connected to the TFT Tr.

A semiconductor layer 912 of an oxide semiconductor material or polycrystalline silicon is formed on the substrate 910. When the semiconductor layer 912 includes an oxide semiconductor material, a light shielding pattern can be formed under the semiconductor layer 912. The light shielding pattern blocks a light incident to the semiconductor layer 912 to prevent deterioration of the semiconductor layer 912 due to the incident light. When the semiconductor layer 912 includes polycrystalline silicon, both side portions of the semiconductor layer 912 can be doped with impurities.

A gate insulating layer 914 of an insulating material is formed on the semiconductor layer 912. The gate insulating layer 914 can include an inorganic insulating material such as silicon oxide ($SiO_2$) and silicon nitride (SiNx). A gate electrode 920 of a conductive material such as a metal is formed on the gate insulating layer 914 corresponding to a central portion of the semiconductor layer 912.

An interlayer insulating layer 922 of an insulating material is formed on the gate electrode 920. The interlayer insulating layer 922 can include an inorganic insulating material such as silicon oxide ($SiO_2$) and silicon nitride (SiNx) or an organic insulating material such as benzocyclobutene (BCB) and photo acryl.

The interlayer insulating layer 922 has first and second contact holes 924 and 926 exposing side portions of the semiconductor layer 912. The first and second contact holes 924 and 926 are disposed at both sides of the gate electrode 920 to be spaced apart from the gate electrode 920. A source electrode 930 and a drain electrode 932 of a conductive material such as a metal are formed on the interlayer insulating layer 922.

The source electrode 930 and the drain electrode 932 are spaced apart from the gate electrode 920 as a center and contact the side portions of the semiconductor layer 912 through the first and second contact holes 924 and 926. The semiconductor layer 912, the gate electrode 920, the source electrode 930 and the drain electrode 932 constitute the TFT Tr of a driving element.

The TFT Tr has a coplanar structure where the gate electrode 920, the source electrode 930 and the drain electrode 932 are disposed over the semiconductor layer 912 in FIG. 10. The TFT Tr can have an inverted staggered structure where the gate electrode is disposed under the semiconductor layer and the source electrode and the drain electrode are disposed over the semiconductor layer in another embodiment. In the TFT Tr of the inverted staggered structure, the semiconductor layer can include amorphous silicon.

A gate line and a data line can cross each other to define a pixel region, and a switching element connected to the gate line and the data line can be formed in the pixel region. A power line can be formed to be spaced apart from and parallel to the gate line or the data line, and a storage capacitor for keeping a voltage of the gate electrode of the TFT Tr constant can be formed in the pixel region.

A passivation layer 934 is formed to cover the TFT Tr. The passivation layer 934 has a drain contact hole 936 exposing the drain electrode 932 of the TFT Tr.

A first electrode 942 is formed on the passivation layer 934 to be divided into each pixel region. The first electrode 942 is connected to the drain electrode 932 of the TFT Tr through the drain contact hole 936. The first electrode 942 can be an anode or a cathode and can include a conductive material having a relatively high work function. For example, the first electrode 942 can include a metal oxide doped or not such as indium-tin-oxide (ITO), indium-zinc-oxide (IZO), indium-tin-zinc oxide (ITZO), indium-copper-oxide (ICO), tin oxide ($SnO_2$), indium oxide ($In_2O_3$), cadmium:zinc oxide (Cd:ZnO), fluorine:tin oxide ($F:SnO_2$), indium:tin oxide ($In:SnO_2$), gallium:tin oxide ($Ga:SnO_2$) and aluminum:zinc oxide (Al:ZnO; AZO) or a non-metallic material such as nickel (Ni), platinum (Pt), gold (Au), silver (Ag), iridium (Ir) or carbon nano tube (CNT).

When the inorganic light emitting diode display device 900 has a top emission type, a reflecting electrode or a reflecting layer can be further formed under the first electrode 942. For example, the reflecting electrode or the reflecting layer can include an aluminum-palladium-copper (APC) alloy.

A bank layer 948 covering an edge portion of the first electrode 942 is formed on the passivation layer 936. The bank layer 948 exposes a central portion of the first electrode 942 corresponding to the pixel region.

An emitting layer 944 including a luminous body 100 is formed on the first electrode 942. The emitting layer 944 can include only an emitting material layer. Alternatively, the emitting layer 944 can include an emitting material layer and a plurality of charge moving layers for improving an emission efficiency. For example, a first charge moving layer 840 (of FIG. 9) can be formed between the first electrode 942 and the emitting layer 944, and a second charge moving layer 860 (of FIG. 9) can be formed between the emitting layer 944 and the second electrode 946.

A second electrode 946 is formed on the emitting layer 944 over the substrate 910. The second electrode 946 can be disposed over a whole of the display area and can include a conductive material having a relatively low work function. The second electrode 946 can be an anode or a cathode. For example, the second electrode 946 can include one of calcium (Ca), barium (Ba), calcium/aluminum (Ca/Al), lithium fluoride/calcium (LiF/Ca), lithium fluoride/aluminum (LiF/Al), barium fluoride/aluminum ($BaF_2$/Al), cesium fluoride/aluminum (CsF/Al), calcium carbonate/aluminum ($CaCO_3$/Al), barium fluoride/calcium/aluminum ($BaF_2$/Ca/Al), aluminum (Al), magnesium (Mg), gold:magnesium (Au:Mg) and silver:magnesium (Ag:Mg).

The luminous body 100 can include a first moiety 110 and a second moiety 120 connected to the first moiety 110. The first moiety 110 includes a first ligand ($L_1$) 116 (of FIG. 2) combined to a surface of an inorganic emitting particle 111 (of FIG. 2) and the second moiety 120 includes silsesquioxanes 124 (of FIG. 2) combined to a second ligand ($L_2$) 122 (of FIG. 2) connected to the first ligand 116. The inorganic emitting particle 111 constituting the first moiety 110 can have a heterologous structure of a core 112 (of FIG. 2) and a shell 114 (of FIG. 2).

A composition ratio of ingredients of the core 112 of the inorganic emitting particle 111 or a thickness of the shell 114 can be adjusted to obtain a light of various wavelength bands. Since the second moiety 120 including silsesquioxanes 124 having a bulky property is formed in the luminous body 100, an adjacent disposition of the inorganic emitting particles 111 is prevented and reduction in emission efficiency due to an FRET phenomenon is prevented. In addition, since one of the first and second ligands 116 and 122 is a non-polar ligand and the other one of the first and second ligands 116 and 122 is a polar ligand, the luminous body 100 can be uniformly dispersed to various polar solvents and various non-polar solvents. As a result, a solvent where a material for the first and second charge moving layers 840 and 860 is not dispersed and the luminous body 100 is dispersed can be properly selected in a soluble process of forming the emitting material layer 850. Accordingly, an interface between layers can be clearly divided, and the emission property and the charge movement property can be improved.

Synthesis Example 1

Fabrication of Red Luminous Body

POSS(MST-300) where thiol (—SH) functional group is adjusted to be reduced was mixed to a quantum dot (QD) powder of about 50 mg where an initial ligand of oleylamine, trioctylphosphine, dodecanthiol and oleic acid is combined to a surface of a red inorganic emitting particle of a hetero structure of indium phosphide/zinc selenide/zinc sulfide (InP/ZnSe/ZnS). After a sample was stirred at about 30° C. for about 2 hours, a sonication was performed to the mixture for about 30 minutes. After a reflux heat treatment was performed to the sample under a nitrogen ($N_2$) ambient or a vacuum state at about 300° C. for about 5 minutes, the sample was cooled down to a room temperature.

Synthesis Example 2

Fabrication of Red Luminous Body

A process for the synthesis example 1 except for the heat treatment of about 350° C. after the sonication was repeated.

Experiment Example 1

Estimation of Dispersion Ability

Figure 11A:
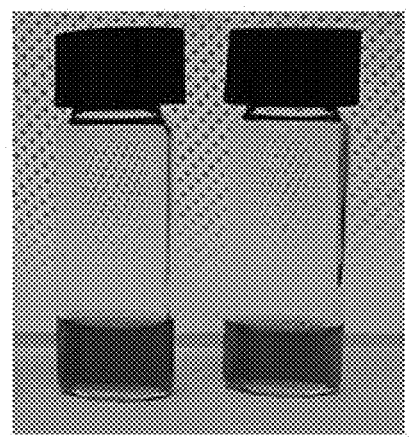
FIGS. 11A to 11C are photographs showing a result of an estimation of dispersion ability of a luminous body with respect to a non-polar solvent and a polar solvent according to an example of the present disclosure.
Figure 11B:
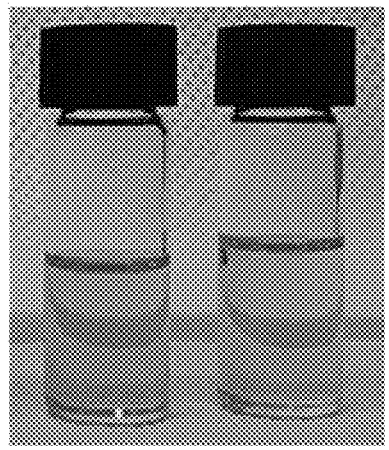
Figure 11C:
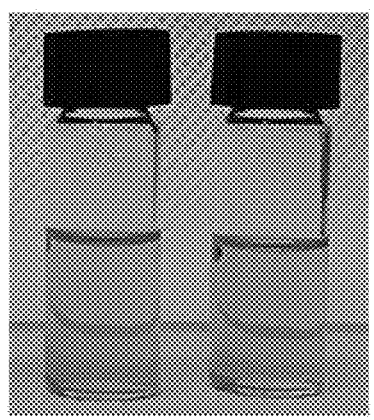

The red luminous bodies synthesized through the synthesis examples 1 and 2 were mixed to toluene of a non-polar solvent and PGMEA of a polar solvent, and a dispersibility was estimated. FIGS. 11A to 11C are photographs showing a result of an estimation of dispersion ability of a luminous body with respect to a non-polar solvent and a polar solvent according to a first embodiment of the present disclosure. In the luminous body, silsesquioxanes moiety of polyhedral oligomeric silsesquioxanes (POSS) structure is connected to alkylene ligand (first ligand) of a non-polar ligand on a surface of a red quantum dot through a sulfide ligand of a polar ligand. In FIGS. 11A to 11C, a left one shows the result of the estimation for the red luminous body of the synthesis example 1, and a right one shows the result of the estimation for the red luminous body of the synthesis example 2. In FIG. 11A, it was verified that POSS is combined to the surface of the QD through a sulfide combination in the synthesis examples 1 and 2. It was verified that the red luminous bodies of the synthesis examples 1 and 2 are uniformly dispersed to toluene of a non-polar solvent in FIG. 11B, and it was verified that the red luminous bodies of the synthesis examples 1 and 2 are uniformly dispersed to PGMEA of a polar solvent in FIG. 11C.

Synthesis Example 3

Fabrication of Green Luminous Body

A process for the synthesis example 1 except for a green inorganic emitting particle of a hetero structure of InP/ZnSe/ZnS and the heat treatment of about 200° C. after the sonication was repeated to the synthesis example 3.

Synthesis Example 4

Fabrication of Green Luminous Body

A process for the synthesis example 1 except for a green inorganic emitting particle of a hetero structure of InP/ZnSe/ZnS and the heat treatment of about 300° C. after the sonication was repeated.

Synthesis Example 5

Fabrication of Green Luminous Body

A process for the synthesis example 1 except for a green inorganic emitting particle of a hetero structure of InP/ZnSe/ZnS and the heat treatment of about 400° C. after the sonication was repeated.

Experiment Example 2

Estimation of Dispersion Ability

Figure 12A:
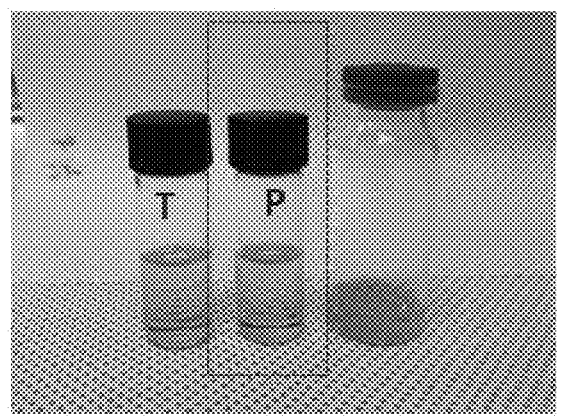
FIGS. 12A to 12C are photographs showing a result of an estimation of dispersion ability of a luminous body with respect to a non-polar solvent and a polar solvent according to an example of the present disclosure.
Figure 12B:
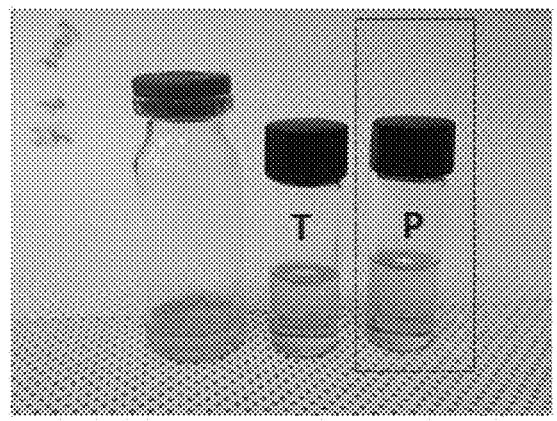
Figure 12C:
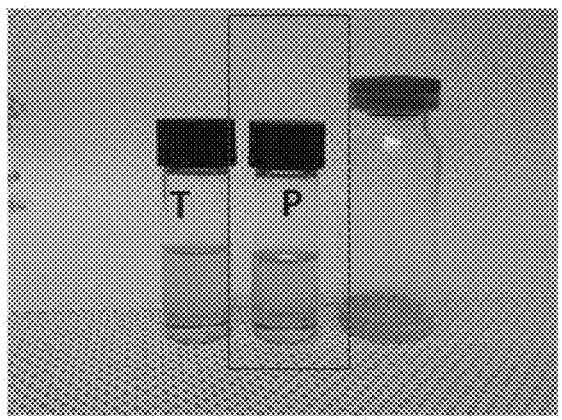

The green luminous bodies synthesized through the synthesis examples 3 to 5 were mixed to toluene of a non-polar solvent and PGMEA of a polar solvent, and a dispersibility was estimated. FIGS. 12A to 12C are photographs showing a result of an estimation of dispersion ability of a luminous body with respect to a non-polar solvent and a polar solvent according to a first embodiment of the present disclosure. In the luminous body, silsesquioxanes moiety of polyhedral oligomeric silsesquioxanes (POSS) structure is connected to alkylene ligand (first ligand) of a non-polar ligand on a surface of a green quantum dot through a sulfide ligand of a polar ligand. In FIGS. 12A to 12C, "T" shows a state where the luminous body is dispersed to toluene of a non-polar solvent, "P" shows a state where the luminous body is dispersed to PGMEA of a polar solvent, and no label shows a state where POSS is connected to the non-polar ligand for the quantum dot moiety through the sulfide ligand of the polar ligand. In FIGS. 12A to 12C, it was verified that POSS is combined to the surface of the QD through a sulfide combination in the synthesis examples 3 to 5 and the green luminous bodies of the synthesis examples 3 to 5 are uniformly dispersed to PGMEA of a polar solvent as well as toluene of a non-polar solvent.

Experiment Example 3

Estimation of Dispersion Ability

Figure 13A:
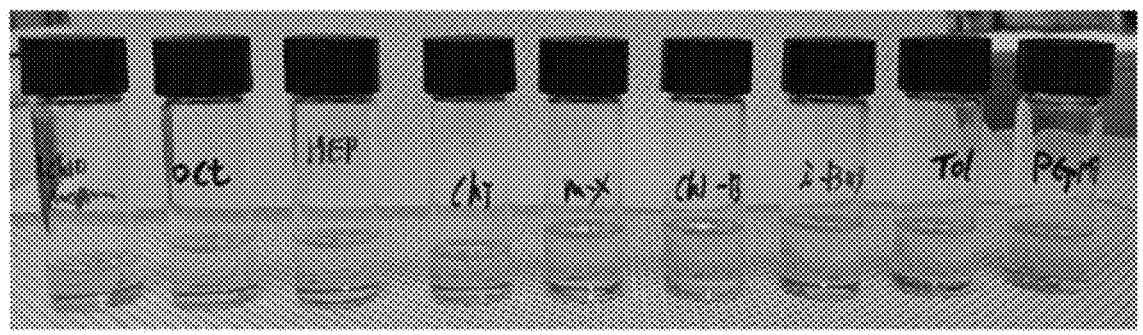
FIGS. 13A and 13B are photographs showing a result of an estimation of dispersion ability of a luminous body with respect to a non-polar solvent and a polar solvent according to an example of the present disclosure.
Figure 13B:
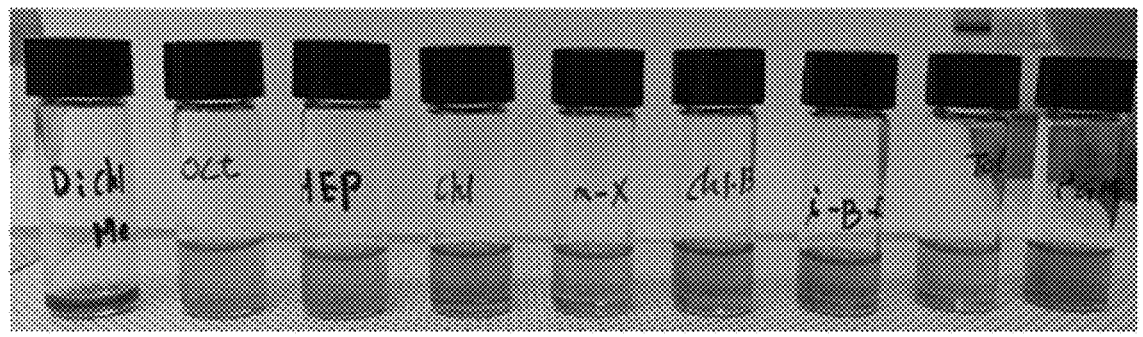

The dispersibility of the red luminous body synthesized through the synthesis example 1 and the green luminous body synthesized through the synthesis example 3 was estimated. FIGS. 13A and 13B are photographs showing a result of an estimation of dispersion ability of a luminous body with respect to a non-polar solvent and a polar solvent according to a first embodiment of the present disclosure. In the luminous body, silsesquioxanes moiety of polyhedral oligomeric silsesquioxanes (POSS) structure is connected to alkylene ligand (first ligand) of a non-polar ligand on a surface of red and green quantum dots through a sulfide ligand of a polar ligand. In FIGS. 13A and 13B, "Dichl Me" represents dichloromethane, "OCT" represents octane, "HEP" represents heptane, "Chl" represents chloroform, "m-X" represents m-xylene, "Chl-B" represents chlorobenzene, "i-But" represents i-butylbenzene, "Tol" represents toluene, and "PGMEA" represents propylene glycol monomethyl ether acetate. In FIGS. 13A and 13B, it was verified that the luminous bodies where POSS is combined to the surface of the QD through a sulfide combination according to the synthesis examples 1 and 3 are uniformly dispersed to a polar solvent such as i-butylbenzene (i-Bul) and PGMEA as well as a non-polar solvent dichloromethane (Dichl Me), octane (OCT), heptanes (HEP), chloroform (Chl), m-xylene (m-x), chlorobenzene (Chl-B) and toluene (Tol).

Synthesis Example 6

Fabrication of Red Luminous Body

A process for the synthesis example 1 except for POSS having a random structure and a cage structure and the thiol functional group having a composition of about 4.02 mmol/g was repeated to synthesize a red luminous body (POSS-SH-1) where POSS is combined to the surface of the inorganic emitting particle through the sulfide group.

Synthesis Example 7

Fabrication of Red Luminous Body

A process for the synthesis example 1 except for POSS having a random structure and a cage structure and the thiol functional group having a composition of about 2.79 mmol/g was repeated to synthesize a red luminous body (POSS-SH-2) where POSS is combined to the surface of the inorganic emitting particle through the sulfide group.

Synthesis Example 8

Fabrication of Red Luminous Body

A process for the synthesis example 1 except for POSS having a random structure and a cage structure and the thiol functional group having a composition of about 2.70 mmol/g was repeated to synthesize a red luminous body (POSS-SH-3) where POSS is combined to the surface of the inorganic emitting particle through the sulfide group.

COMPARISON SYNTHESIS EXAMPLE 1

A process for the synthesis example 1 except for POSS having a methyl functional group instead of a thiol functional group was repeated.

Experiment Example 4

Estimation of Dispersion Ability

Figure 14:
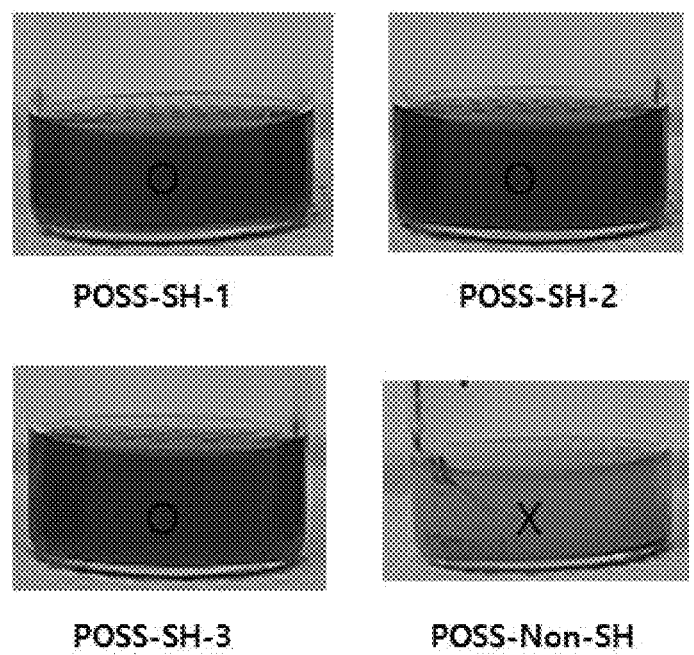
FIG. 14 is a photograph showing a state where a luminous body synthesized by a ligand exchange reaction at a surface of a quantum dot using POSS having different composition of thiol is uniformly dispersed to PGMEA according to an example of the present disclosure.

The dispersibility of the luminous bodies synthesized through the synthesis examples 6 to 8 was estimated. FIG. 14 is a photograph showing a state where a luminous body synthesized by a ligand exchange reaction at a surface of a quantum dot using POSS having different composition of thiol is uniformly dispersed to PGMEA according to a first embodiment of the present disclosure. It was verified that POSS having thiol functional group is combined to the surface of the red emitting particle through a thiolene reaction. In addition, it was verified that POSS having methyl functional group is not combined to the surface of the red emitting particle without the thiolene reaction and the red luminous body is not uniformly dispersed.

Experiment Example 5

Verification of Combination of QD and POSS

Figure 15:
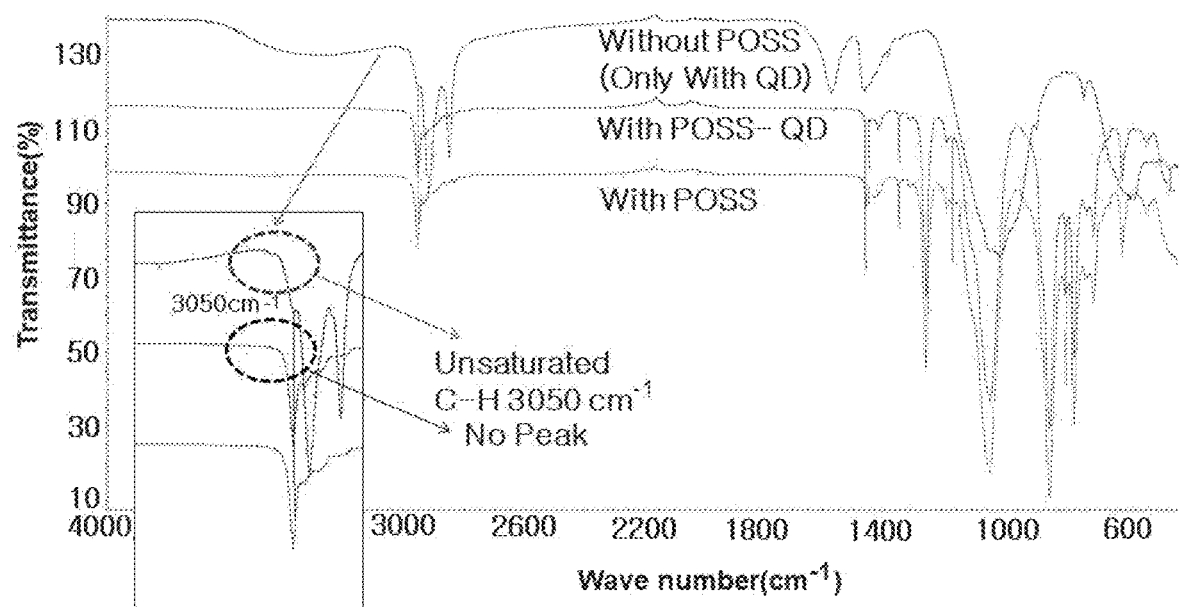
FIG. 15 is a graph showing a result of an IR spectroscopy analysis of a luminous body according to an example of the present disclosure.

An ingredient analysis according to an inductively coupled plasma mass spectroscopy (IPC-MS) and an infrared (IR) spectroscopy analysis were performed to the green luminous body synthesized through the synthesis example 3. TABLE 1 illustrates a result of the IPC-MS ingredient analysis, and FIG. 15 is a graph showing a result of an IR spectroscopy analysis of a luminous body according to a first embodiment of the present disclosure. For comparison, the result of the ingredient analysis for the green emitting particle where the initial ligand is combined before POSS is combined is illustrated in TABLE 2, and the result of the IR spectroscopy analysis for the surface of the QD where POSS is not combined and the result of the IR spectroscopy analysis for POSS are shown in FIG. 15.

TABLE 1

Ingredient Analysis Of Green Luminous Body Of Synthesis Example 3

| Element | Detected Concentration (ppb) |
| --- | --- |
| In | 1,190 |
| Zn | 650 |
| Si | 368 |

TABLE 1-continued

Ingredient Analysis Of Green Luminous Body Of Synthesis Example 3

| Element | Detected Concentration (ppb) |
| --- | --- |
| Ga | 190 |
| P | 110 |
| Se | 75 |
| Cu | <0.1 |
| Mn | <0.1 |
| Cd | <0.1 |
| Ni | <0.1 |
| Al | <0.1 |

TABLE 2

Ingredient Analysis Of Green Luminous Body Without POSS

| Element | Detected Concentration (ppb) |
| --- | --- |
| In | 1,170 |
| Zn | 660 |
| Ga | 210 |
| P | 140 |
| Se | 50 |
| Cu | <0.1 |
| Mn | <0.1 |
| Cd | <0.1 |
| Ni | <0.1 |
| Al | <0.1 |
| Si | <0.1 |

In TABLEs 1 and 2, although the green emitting particle without POSS has a minute composition (<0.1 ppb) of silicon, it was verified that the red emitting particle with POSS through the sulfide combination due to the selenol reaction has an increased composition (380 ppb) of silicon. In FIG. 15, although the unsaturated double bond (3050 cm$^{-1}$) due to the initial ligand such as oleylamine is detected in the red emitting particle without POSS, it was verified that the unsaturated double bond is separated and is not detected in the red emitting particle with POSS. As a result, it was verified that POSS is combined to the red emitting particle through the sulfide group due to the selenol reaction.

Synthesis Example 9

Fabrication of Red Luminous Body

A QD powder of about 100 mg where an initial ligand of oleylamine, trioctylphosphine, dodecanthiol and oleic acid is combined to a surface of a red inorganic emitting particle of a hetero structure of InP/ZnSe/ZnS was mixed to a hexane based solvent. After POSS(MST-300) of about 2 g where thiol (—SH) functional group is adjusted to be reduced was mixed to a solution, the solution was stirred for about 30 minutes. After cumyl hydroperoxide (2-hydroperoxypropan-2-yl benzene) of about 1 wt % was mixed to the solution, a sonication was performed to the solution. After an air in the solution is removed by bubbling the solution in $N_2$ ambient, a reaction was performed in $N_2$ ambient at about 80° C. for about 10 minutes and then the solution was cooled down to a room temperature.

Synthesis Examples 10 to 14

Fabrication of Red Luminous Body

A process for the synthesis example 9 except for a reaction of a solution of a red quantum dot (QD) power, POSS and cumyl hydroperoxide (2-hydroperoxypropan-2-yl benzene) at about 90° C. for about 10 minutes (synthesis example 10), at about 100° C. for about 10 minutes (synthesis example 11), at about 110° C. for about 10 minutes (synthesis example 12), at about 120° C. for about 10 minutes (synthesis example 13) and at about 130° C. for about 10 minutes (synthesis example 14) was repeated to the synthesis examples 10 to 14.

Synthesis Example 15

Fabrication of Green Luminous Body

A process for the synthesis example 9 except for usage of a green inorganic emitting particle of a hetero structure of indium phosphide/zinc selenide/zinc sulfide (InP/ZnSe/ZnS) as an inorganic emitting particle was repeated to the synthesis example 15 to synthesize a green luminous body.

Comparison Synthesis Examples 2 to 7

Fabrication of Red Luminous Body

A process for the first embodiment except for a heat treatment at about 80° C. for about 10 minutes (comparison synthesis example 2), at about 90° C. for about 10 minutes (comparison synthesis example 3), at about 100° C. for about 10 minutes (comparison synthesis example 4), at about 110° C. for about 10 minutes (comparison synthesis example 5), at about 120° C. for about 10 minutes (comparison synthesis example 6) and at about 130° C. for about 10 minutes (comparison synthesis example 7) to a sample of a red quantum dot (QD) powder and POSS was repeated to the comparison synthesis examples 2 to 7 to synthesize a red luminous body.

Experiment Example 6

Estimation of Dispersion Ability

The red luminous bodies synthesized through the synthesis examples 9 to 4 and the comparison synthesis examples 2 to 7 were mixed to toluene of a non-polar solvent and PGMEA of a polar solvent, and a dispersibility was estimated. The green luminous bodies of the synthesis examples 9 to 14 were uniformly dispersed to PGMEA of a polar solvent as well as toluene of a non-polar solvent. The green luminous bodies of the comparison synthesis examples 2 to 7 were uniformly dispersed to toluene of a non-polar solvent. However, the green luminous bodies of the comparison synthesis examples 2 to 7 were not dispersed to be settled in PGMEA of a polar solvent.

Experiment Example 7

Estimation of Emission Property of Luminous Body

A quantum yield (QY), a full width at half maximum (FWHM) and a photoluminescence (PL) wavelength were measured for the red luminous body of the synthesis example 2 through the heat treatment at about 350° C., the green luminous body of the synthesis example 5 through the heat treatment at about 400° C., the red luminous body of the synthesis example 9 through the reaction at about 80° C. with the catalyst and the green luminous body of the synthesis example 15 through the reaction at about 80° C. with the catalyst. For comparison, a QY, an FWHM and a PL wavelength were measured for the red emitting particle and the green emitting particle of a hetero structure of indium phosphide/zinc selenide/zinc sulfide (InP/ZnSe/ZnS) where an initial ligand is combined to a surface thereof. TABLE 3 illustrates a result of measurement. In TABLE 3, the FWHM and the PL wavelength of the luminous bodies having POSS through the high temperature heat treatment or the luminous bodies having POSS through the low temperature reaction using the catalyst was similar to the FWHM and the PL wavelength of the emitting particles.

However, the QY of the luminous bodies having POSS through the high temperature heat treatment was reduced by about 21.5% (red luminous body) or about 32.4% (green luminous body) as compared with the emitting particles. The QY of the luminous bodies having POSS through the low temperature reaction using the catalyst was reduced by about 5% (red luminous body) or about 10% (green luminous body) as compared with the emitting particles. As a result, a luminous body having a relatively excellent emission property was fabricated by inducing the low temperature reaction of the emitting particle and POSS precursor with the catalyst as compared with a luminous body through the high temperature heat treatment.

TABLE 3

Emission Property Of Inorganic Luminous Body

| | Sample | QY | FWHM | PL (nm) |
|---|---|---|---|---|
| Red Emission | Emitting Particle | 70 | 52 | 630 |
| | Synthesis Example 2 | 55 | 52 | 630 |
| | Synthesis Example 9 | 65 | 52 | 630 |
| Green Emission | Emitting Particle | 71 | 39 | 530 |
| | Synthesis Example 5 | 48 | 40 | 531 |
| | Synthesis Example 15 | 64 | 40 | 530 |

Experiment Example 8

Estimation of Emission Property and Ingredient of Luminous Body

Figure 16:
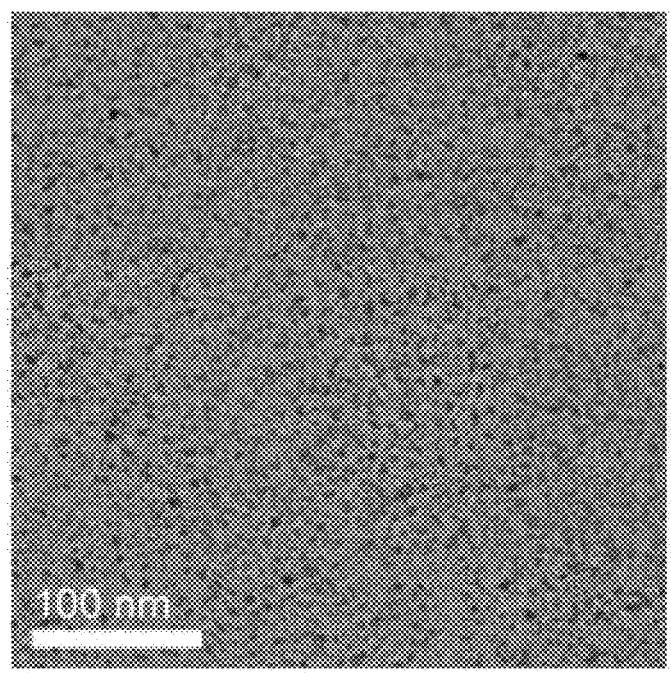
FIG. 16 is a photograph of TEM showing a luminous body according to an example of the present disclosure.
Figure 17A:
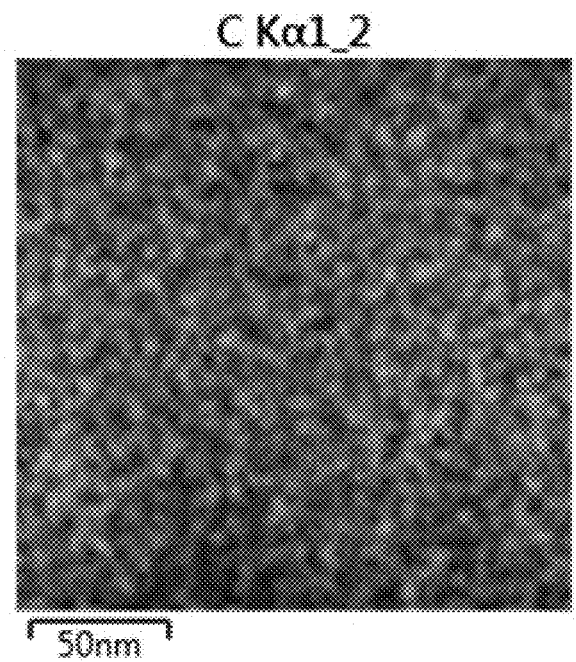
FIGS. 17A to 17G are photographs showing a result of an EDS analysis of elements of a luminous body according to an example of the present disclosure.
Figure 17B:
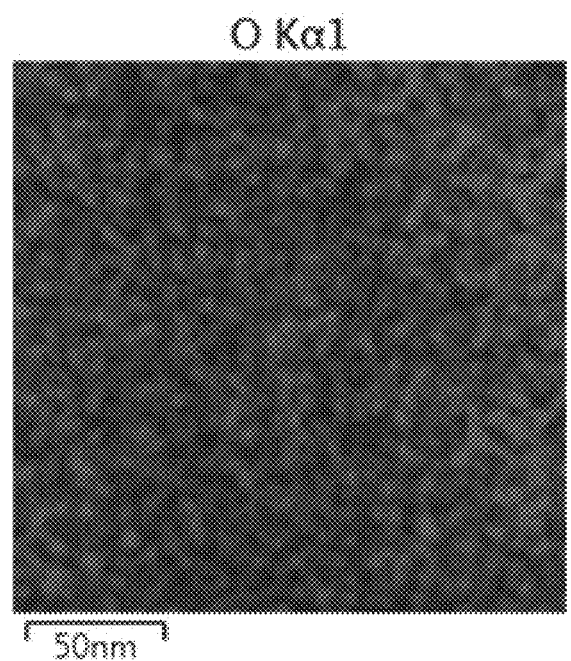
Figure 17C:
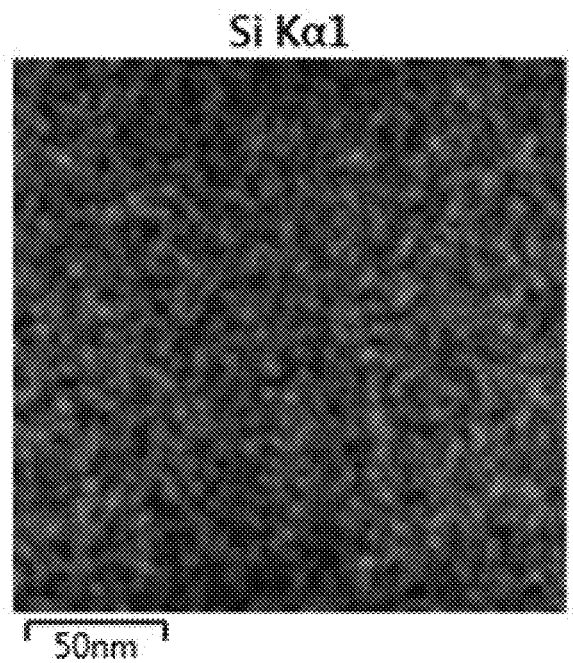
Figure 17D:
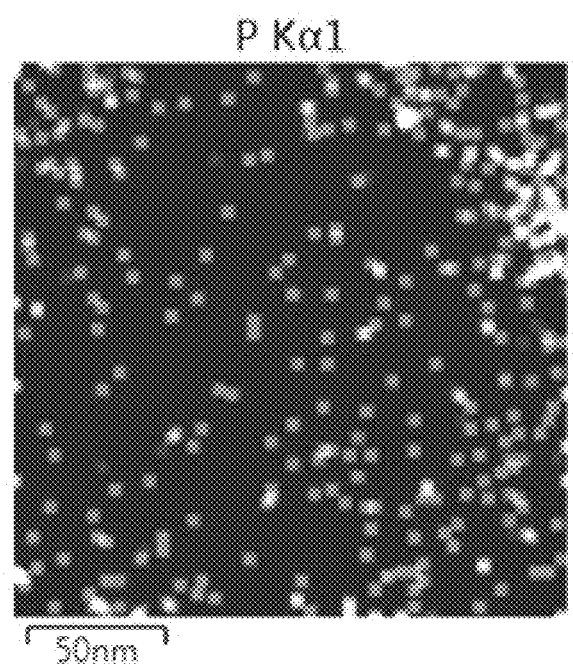
Figure 17E:
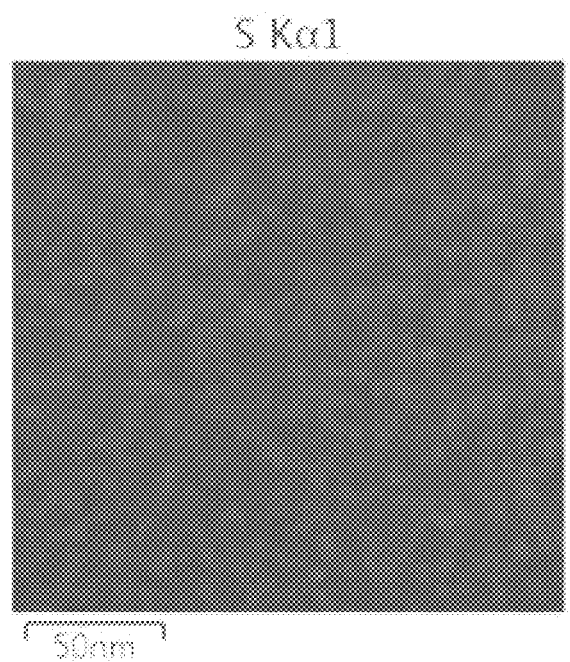
Figure 17F:
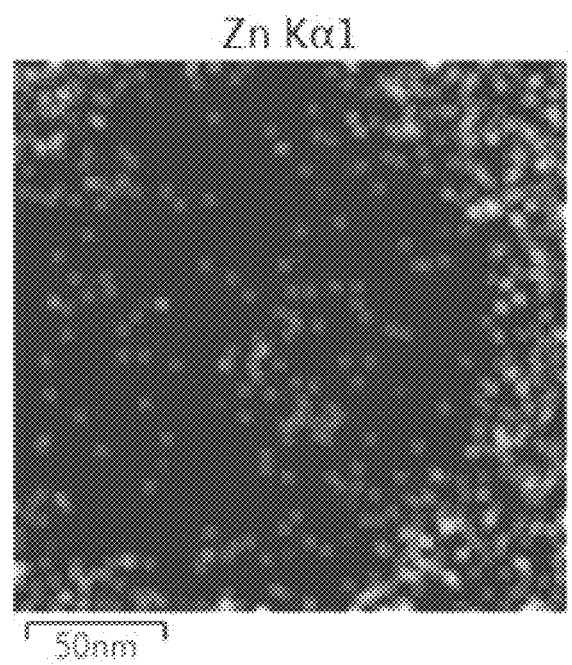
Figure 17G:
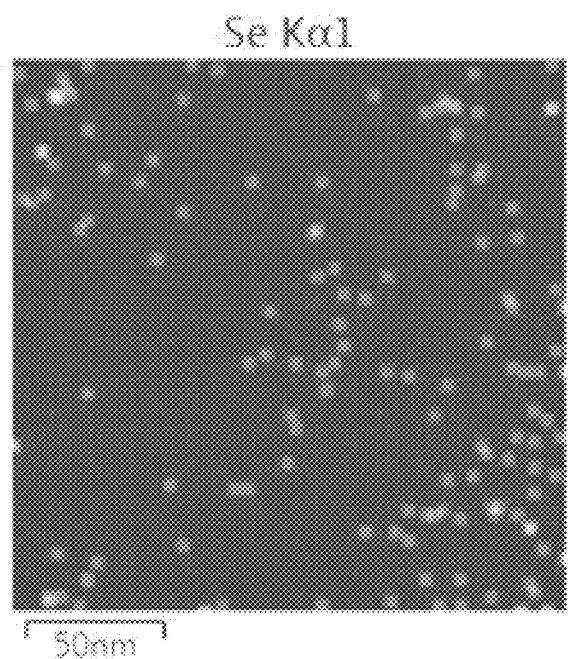

The green luminous body of the synthesis example 15 was analyzed by using a tunneling electron microscopy (TEM). The result of the analysis is shown in FIG. 16. The POSS moieties were uniformly dispersed on a surface of the inorganic emitting particle.

The result of an energy dispersive X-ray spectroscopy (EDS) analysis is shown in FIGS. 17A to 17G. Oxygen (O) and silicon (Si) from the $SiO_2$ structure constituting POSS as well as phosphorus (P), sulfur (S), zinc (Zn) and selenium (Se) were detected. As a result, the initial ligand on the surface of the inorganic emitting particle was substituted with the other ligand, and the inorganic emitting particle was combined to POSS through the other ligand.

Consequently, a luminous body according to an embodiment of the present disclosure includes a first moiety having a first ligand combined to a surface of an inorganic emitting particle and a second moiety having silsesquioxanes connected to a second ligand connected to the first ligand. Since one of the first and second ligands is a polar ligand and the other one of the first and second ligands is a non-polar ligand, the luminous body is uniformly dispersed to a polar ligand as well as a non-polar ligand.

In addition, since the luminous body includes silsesquioxanes moiety of silicon at an outer portion thereof, a dispersion property with respect to a heat resistive resin such as silicon resin is improved.

Further, since the bulky second moiety such as silsesquioxanes is combined to an outer portion of the inorganic emitting particle, the inorganic emitting particles including the first moiety relating to emission are not disposed within a predetermined distance. A FRET phenomenon caused by adjacent disposition of the inorganic emitting particles is prevented and an emission property of a device including the luminous body is improved.

Moreover, since the luminous body includes silsesquioxanes moiety having an excellent heat resistance property, a heat resistance property of the luminous body is improved.

Accordingly, the luminous body can be applied to a light emitting film, a light emitting diode package, a light converting layer and a light emitting diode of a light emitting device such as a display device where an excellent dispersion property with respect to an organic solvent and/or a matrix resin and an excellent emission property are required.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A luminous body, comprising:
a first moiety including a plurality of first ligands combined to a surface of an inorganic emitting particle; and
a second moiety including a second ligand connected to each of the first ligands and silsesquioxanes connected to the second ligand,
wherein each first ligand is independently a $C_1$-$C_{20}$ alkylene group and the second ligand is a sulfide group having a $C_{11}$-$C_{20}$ alkyl group, and
wherein the second ligand is connected to each of the first ligands via the sulfide group and is connected to the silsesquioxanes through the $C_{11}$-$C_{20}$ alkyl group.

2. The luminous body of claim 1, wherein the inorganic emitting particle has a single structure, or a heterologous structure where a core emitting a light is disposed at a center portion and a shell wraps a surface of the core.

3. The luminous body of claim 1, wherein the silsesquioxanes have a siloxane unit of a T type.

4. The luminous body of claim 1, wherein the silsesquioxanes have one of a random structure, a ladder structure, an incomplete cage structure and a complete cage structure.

5. A light emitting display device, comprising:
a first substrate;
a second substrate facing the first substrate;
a light emitting diode between the first and second substrates;
a light converting layer configured to convert a wavelength of a light emitted from the light emitting diode, the light converting layer including a luminous body,
wherein the luminous body comprises:
a first moiety including a plurality of first ligands combined to a surface of an inorganic emitting particle; and
a second moiety including a second ligand connected to each of the first ligands and silsesquioxanes connected to the second ligand,
wherein each first ligand is independently a $C_1$-$C_{20}$ alkylene group and the second ligand is a sulfide group having a $C_{11}$-$C_{20}$ alkyl group, and
wherein the second ligand is connected to each of the first ligands via a sulfide group and is connected to the silsesquioxanes through the $C_{11}$-$C_{20}$ alkyl group.

6. The light emitting display device of claim 5, wherein the light converting layer is disposed between the first substrate and the light emitting diode or between the second substrate and the light emitting diode.

7. The light emitting display device of claim 5, wherein the first and second substrates include a red pixel region,
wherein the light converting layer includes a red light converting layer in the red pixel region, and
wherein the luminous body of the red light converting layer includes a red inorganic emitting particle converting the light emitted from the light emitting diode into a red-colored light.

8. The light emitting display device of claim 7, wherein the first and second substrates include a green pixel region,
wherein the light converting layer includes a green light converting layer in the green pixel region, and
wherein the luminous body of the green light converting layer includes a green inorganic emitting particle converting the light emitted from the light emitting diode into a green-colored light.

9. A light emitting film, comprising:
a luminous body; and
a matrix resin where the luminous body is dispersed,
wherein the luminous body comprises:
a first moiety including a plurality of first ligands combined to a surface of an inorganic emitting particle; and
a second moiety including a second ligand connected to at least one of the first ligands and silsesquioxanes connected to the second ligand,
wherein each first ligand is independently a $C_1$-$C_{20}$ alkylene group and the second ligand is a sulfide group having a $C_{11}$-$C_{20}$ alkyl group, and
wherein the second ligand is connected to each of the first ligands via the sulfide group and is connected to the silsesquioxanes through the $C_{11}$-$C_{20}$ alkyl group.

10. A liquid crystal display device, comprising:
a liquid crystal panel;
a backlight unit under the liquid crystal panel and including a light source; and
a light emitting film between the liquid crystal panel and the backlight unit,
wherein the light emitting film comprises:
a luminous body; and
a matrix resin where the luminous body is dispersed,
wherein the luminous body comprises:
a first moiety including a plurality of first ligands combined to a surface of an inorganic emitting particle; and
a second moiety including a second ligand connected to each of the first ligands and silsesquioxanes connected to the second ligand,
wherein each first ligand is independently a $C_1$-$C_{20}$ alkylene group and the second ligand is a sulfide group having a $C_{11}$-$C_{20}$ alkyl group, and
wherein the second ligand is connected to each of the first ligands via the sulfide group and is connected to the silsesquioxanes through the $C_{11}$-$C_{20}$ alkyl group.

11. A light emitting diode (LED) package, comprising:
an LED chip; and
an encapsulation part covering the LED chip, the encapsulation part including a luminous body,
wherein the luminous body comprises:
a first moiety including a plurality of first ligands combined to a surface of an inorganic emitting particle; and a second moiety including a second ligand connected to each of the first ligands and silsesquioxanes connected to the second ligand, wherein each first ligand is independently a $C_1$-$C_{20}$ alkylene group and the second ligand is a sulfide group having a $C_{11}$-$C_{20}$ alkyl group, and wherein the second ligand is connected to each of the first ligands via the sulfide group and is connected to the silsesquioxanes through the $C_{11}$-$C_{20}$ alkyl group.

12. A liquid crystal display device, comprising:

a backlight unit including a light emitting diode (LED) package; and a liquid crystal panel over the backlight unit, wherein the LED package comprises:

an LED chip; and an encapsulation part covering the LED chip, the encapsulation part including a luminous body, wherein the luminous body comprises:

a first moiety including a plurality of first ligands combined to a surface of an inorganic emitting particle; and a second moiety including a second ligand connected to each of the first ligands and silsesquioxanes connected to the second ligand, wherein each first ligand is independently a $C_1$-$C_{20}$ alkylene group and the second ligand is a sulfide group having a $C_{11}$-$C_{20}$ alkyl group, and wherein the second ligand is connected to each of the first ligands via the sulfide group and is connected to the silsesquioxanes through the $C_{11}$-$C_{20}$ alkyl group.

13. An inorganic light emitting diode, comprising:

a first electrode;

a second electrode facing the first electrode; and a light emitting layer between the first and second electrode, the light emitting layer including a luminous body, wherein the luminous body comprises:

a first moiety including a plurality of first ligands combined to a surface of an inorganic emitting particle; and a second moiety including a second ligand connected to each of the first ligands and silsesquioxanes connected to the second ligand, wherein each first ligand is independently a $C_1$-$C_{20}$ alkylene group and the second ligand is a sulfide group having a $C_{11}$-$C_{20}$ alkyl group, and wherein the second ligand is connected to each of the first ligands via the sulfide group and is connected to the silsesquioxanes through the $C_{11}$-$C_{20}$ alkyl group.

14. An inorganic light emitting device, comprising:

a substrate;

an inorganic light emitting diode on the substrate; and a driving element between the substrate and the inorganic light emitting diode, the driving element connected to the inorganic light emitting diode, wherein the inorganic light emitting diode comprises:

a first electrode;

a second electrode facing the first electrode; and a light emitting layer between the first and second electrode, the light emitting layer including a luminous body, wherein the luminous body comprises:

a first moiety including a plurality of first ligands combined to a surface of an inorganic emitting particle; and a second moiety including a second ligand connected to each of the first ligands and silsesquioxanes connected to other end of the second ligand, wherein each first ligand is independently a $C_1$-$C_{20}$ alkylene group and the second ligand is a sulfide group having a $C_{11}$-$C_{20}$ alkyl group, and wherein the sulfide group in the second ligand is connected to the first ligand and the $C_{11}$-$C_{20}$ alkyl group in the second ligand is connected to the silsesquioxanes.

15. The luminous body of claim 1, wherein the inorganic emitting particle includes a quantum dot (QD) or a quantum rod (QR).

16. The inorganic light emitting diode of claim 13, wherein the inorganic emitting particle includes a quantum dot (QD) or a quantum rod (QR).

17. The inorganic light emitting device of claim 14, wherein the inorganic emitting particle includes a quantum dot (QD) or a quantum rod (QR).

\* \* \* \* \*